United States Patent [19]
Yamakido et al.

[11] Patent Number: 5,515,047
[45] Date of Patent: May 7, 1996

[54] CONVERTER, OFFSET ADJUSTOR, AND PORTABLE COMMUNICATION TERMINAL UNIT

[75] Inventors: Kazuo Yamakido, Hinode; Yoichiro Kobayashi, Ohme; Masanori Otsuka, Kokubunji; Takao Okazaki, Hamura; Yukihito Ishihara, Ohme; Norimitsu Nishikawa, Ohme; Yuko Tamba, Ohme, all of Japan

[73] Assignee: Hitachi, Ltd., Tokyo, Japan

[21] Appl. No.: 170,411

[22] Filed: Dec. 20, 1993

[30] Foreign Application Priority Data

| Dec. 29, 1992 | [JP] | Japan | 4-359957 |
| Feb. 19, 1993 | [JP] | Japan | 5-055188 |
| Oct. 21, 1993 | [JP] | Japan | 5-285514 |

[51] Int. Cl.$^6$ ............................................. H03M 1/06
[52] U.S. Cl. ............................................. 341/153; 341/153
[58] Field of Search ............................ 341/118, 145, 341/153

[56] References Cited

U.S. PATENT DOCUMENTS

| 3,961,326 | 6/1976 | Craven | 341/145 |
| 3,967,272 | 6/1976 | Sandford, Jr. | 341/145 |
| 4,020,486 | 4/1977 | Pastoriza | 341/145 |
| 4,118,699 | 10/1978 | Comer | 341/153 |
| 4,947,172 | 8/1990 | Suzuki | 341/145 |
| 4,963,870 | 10/1990 | Obinata | 341/118 |
| 4,972,188 | 11/1990 | Clement et al. | 341/118 |
| 5,283,580 | 2/1994 | Brooks et al. | 341/145 |

FOREIGN PATENT DOCUMENTS

2805475A1  8/1978  Germany .
2115248    9/1983  United Kingdom .

OTHER PUBLICATIONS

Gendai, Yuji, et al. Digest of Technical Papers of International Solid State Circuits Conference, issued Feb. 14, 1991, pp. 128–129. (English).

Yamakido, Kazuo, et al. "A Single–Chip CMOS Filter/Codec," IEEE Journal of Solid–State Circuits, vol. SC–16, No. 4, Aug. 1981, pp. 302–307. (English).

*Primary Examiner*—Marc S. Hoff
*Attorney, Agent, or Firm*—Fay, Sharpe, Beall, Fagan, Minnich & McKee

[57] ABSTRACT

The number of current sources and switches necessary for a plurality of unit D/A converters using equal reference currents, are drastically reduced to reduce the parasitic capacitance coupled to current output lines, by converting a plurality of digital signals of a predetermined bit, which are divided from an input digital signal, into an analog current unit D/A converters and by converting the analog current in a manner to correspond to the weights of the corresponding input digital signals, thereby to synthesize the currents. The fixed reference digital signal is inputted to the D/A converter for cancelling offsets. The offsets of a plurality of analog output signals in positive and opposite phases obtained by branching the output of the D/A converter are individually detected. After this, the DC offset values of the individual analog outputs are used as offset adjusted negative feedback signals for a desired value. One of them is the digital signal to be fed back to the input portion of the D/A converter whereas the other is the analog signal to be fed to a path portion obtained by branching the output of the D/A converter.

9 Claims, 19 Drawing Sheets

FIG. 2

| D7 | D6 | D5 | D4 | TF | TE | TD | TC | TB | TA | T9 | T8 | T7 | T6 | T5 | T4 | T3 | T2 | T1 |
|---|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 1 | 0 | 0 | 0 | 0 | 0 | 0 | 0 | 0 | 0 | 0 | 0 | 0 | 0 | 0 | 1 |
| 0 | 0 | 1 | 0 | 0 | 0 | 0 | 0 | 0 | 0 | 0 | 0 | 0 | 0 | 0 | 0 | 0 | 1 | 1 |
| 0 | 0 | 1 | 1 | 0 | 0 | 0 | 0 | 0 | 0 | 0 | 0 | 0 | 0 | 0 | 0 | 1 | 1 | 1 |
| 0 | 1 | 0 | 0 | 0 | 0 | 0 | 0 | 0 | 0 | 0 | 0 | 0 | 0 | 0 | 1 | 1 | 1 | 1 |
| 0 | 1 | 0 | 1 | 0 | 0 | 0 | 0 | 0 | 0 | 0 | 0 | 0 | 0 | 1 | 1 | 1 | 1 | 1 |
| 0 | 1 | 1 | 0 | 0 | 0 | 0 | 0 | 0 | 0 | 0 | 0 | 0 | 1 | 1 | 1 | 1 | 1 | 1 |
| 0 | 1 | 1 | 1 | 0 | 0 | 0 | 0 | 0 | 0 | 0 | 0 | 1 | 1 | 1 | 1 | 1 | 1 | 1 |
| 1 | 0 | 0 | 0 | 0 | 0 | 0 | 0 | 0 | 0 | 0 | 1 | 1 | 1 | 1 | 1 | 1 | 1 | 1 |
| 1 | 0 | 0 | 1 | 0 | 0 | 0 | 0 | 0 | 0 | 1 | 1 | 1 | 1 | 1 | 1 | 1 | 1 | 1 |
| 1 | 0 | 1 | 0 | 0 | 0 | 0 | 0 | 0 | 1 | 1 | 1 | 1 | 1 | 1 | 1 | 1 | 1 | 1 |
| 1 | 0 | 1 | 1 | 0 | 0 | 0 | 0 | 1 | 1 | 1 | 1 | 1 | 1 | 1 | 1 | 1 | 1 | 1 |
| 1 | 1 | 0 | 0 | 0 | 0 | 0 | 1 | 1 | 1 | 1 | 1 | 1 | 1 | 1 | 1 | 1 | 1 | 1 |
| 1 | 1 | 0 | 1 | 0 | 0 | 1 | 1 | 1 | 1 | 1 | 1 | 1 | 1 | 1 | 1 | 1 | 1 | 1 |
| 1 | 1 | 1 | 0 | 0 | 1 | 1 | 1 | 1 | 1 | 1 | 1 | 1 | 1 | 1 | 1 | 1 | 1 | 1 |
| 1 | 1 | 1 | 1 | 1 | 1 | 1 | 1 | 1 | 1 | 1 | 1 | 1 | 1 | 1 | 1 | 1 | 1 | 1 |

CONVERTER, OFFSET ADJUSTOR, AND PORTABLE COMMUNICATION TERMINAL UNIT

BACKGROUND OF THE INVENTION

The present invention relates to a D/A (i.e., Digital/Analog) converter and an output offset adjustor for an electronic circuit and, more particularly, to a circuit such as a portable communication terminal unit which includes a D/A converter formed on a semiconductor integrated circuit device operating under low voltage and with low power consumption, to adjust the output offset of an electronic circuit having a plurality of precise and stable analog signal outputs.

In the prior art, the so-called "current drive type D/A converter" is equipped with a plurality of current sources having substantially different current values for selectively validating current sources according to digital signals of a predetermined bit, to produce analog currents corresponding to the digital signals. There is also a portable communication terminal unit which has such a D/A converter packaged therein.

The current drive type D/A converter is disclosed on pp. 128 to 129 of Digest of Technical Papers of International Solid State Circuits Conference, issued on Feb. 14, 1991.

There may be the case in which an undesired offset is present in the output of a circuit due to the dispersion of the characteristics of elements composing the circuit. This offset may be such that the reference level of the output waveform of the circuit is different from that expected. There are two methods of adjusting this offset. In the first method the positive and negative components of AC signals outputted from an electronic circuit are integrated for a relatively long time so that low frequency components are obtained, i.e., the approximate DC components are negatively fed back in a sequential manner to a suitable node of the electronic circuit.

This first method could be used in applications in which the signal to be handled, such as a speech signal intrinsically, contains no DC component and in which the electronic circuit cannot be interrupted in the course of operation. This is disclosed in papers entitled "A Single-Chip CMOS Filter/Codec)", on pp. 302 to 307, SC-16 of IEEE JOURNAL OF SOLID-STATE CIRCUITS (August, 1981).

In the second method, on the other hand, prior to the application of AC input signals to an electronic circuit, reference DC signals are inputted for a suitable time period and are detected from the electronic circuit. The DC signals for compensating or adjusting the output value to a suitable value are negatively fed back in a fixed manner to a suitable node of the electronic circuit. This second method is frequently used where the DC component itself contained in the output of the electronic circuit is handled as an important signal. The second method is disclosed in U.S. Pat. No. 5,061,900 (issued Oct. 29, 1991).

SUMMARY OF THE INVENTION

In the field of the portable communication terminal units or the like, the power consumption of the circuit and the voltage level of the power supply are being reduced as the size and weight of the device are reduced. Especially in the portable communication terminal unit having a combined analog circuit and digital circuit, however, the amplitude of the analog signal is restricted as the supply voltage drops making it difficult to retain the desired signal-to-noise (i.e., S/N) characteristics by the noises coming from an external digital circuit or an internal digital circuit. Under these circumstances, we have found that the aforementioned current drive type D/A converter is the most suitable for the portable communication terminal unit, and we have developed the portable communication terminal unit having the current drive type D/A converter prior to the present invention.

When the size and power consumption of the portable communication terminal unit are further reduceds the following problems have been found in the aforementioned current drive type D/A converter. Specifically, the current drive type D/A converter is equipped, as shown in FIG. 15, with a unit D/A converter UDA1 connected to digital signals D0 to D3 of less significant 4 bits, and a unit D/A converter UDA2 connected to digital signals D4 to D7 of more significant 4 bits.

The less significant bit unit D/A converter UDA1 is constructed, for example, to include: a current source C1 for producing a predetermined unit current; a reference current MOSFET Q15 for setting a reference current value; four current dividing MOSFETs Q11 to Q14 for dividing the unit current according to their size ratios to the reference current MOSFET Q15; and two sets of four switches S11a to S14a and S11b to S14b to be selectively turned ON in response to the less significant 4-bit digital signals D0 to D3 to selectively transmit the unit currents, which are divided by the current dividing MOSFETs Q11 to Q14, to a non-inverted current output line IoT or an inverted current output line IoB.

The more significant bit unit D/A converter UDA2 is constructed to include: a thermometer coder TMCD responsive to the more significant 4-bit digital signals D4 to D7, for producing their output signals T1 to TF selectively; fifteen current sources C21 to C2F for producing the unit currents individually; fifteen MOSFETs Q21 to Q2F provided to correspond to current sources C21 to C2F and having a size sixteen times as large as that of the reference current MOSFET Q15; and two sets of fifteen switches S21a to S2Fa and S21b to S2Fb to be selectively turned on according to the output signals T1 to TF of the thermometer coder TMCD, for selectively transmitting the unit currents, which are produced by the corresponding current sources C21 to C2F, to the non-inverted current output line IoT or the inverted current output line IoB.

Where the conversion precision of the D/A converter is considered, the size ratios of the aforementioned current dividing MOSFETs Q11 to Q14 and Q21 to Q2F to the reference current MOSFET Q15 have to be highly precise, and the size ratios of the switches S12a to S14a, S12b to S14b, S21a to S2Fa, and S21b to S2Fb to the switches S11a and S11b of the minimum size, also have to be accordingly precise. In order to suppress the influence of the working size fluctuation due to the process dispersion at the time of manufacturing the semiconductor, moreover, the reference current MOSFET Q15 and the switches S11a and S11b having the minimum sizes have to be enlarged to some extent so that the sizes of the remaining current dividing MOSFETs and the switches are enlarged in proportion to those having minimum sizes.

As is apparent from FIG. 15, the number of current dividing MOSFETs and switches required by the D/A converter can be as many as (15+16×15), i.e., 255 in total, if the calculations are accomplished by assuming that both the reference current MOSFET Q15 and the switches S11a and S11b having the minimum sizes are one. As a result, the physical size of the D/A converter is increased to restrict the reductions of the size and power consumption of the portable communication terminal unit including the D/A converter.

The analog currents obtained on the non-inverted current output line IoT and the inverted current output line IoB of the D/A converter are converted into voltage signals through an operational amplifier having a feedback resistor and a current-voltage converter. As is well known in the art, the operational amplifier is designed to have a predetermined range for passing a desired signal band by a phase compensation. Coupled to the non-inverted current output line IoT and the inverted current output line IoB, however, are the parasitic capacitance of the 255 MOSFETs, as has been described above. As a results a phase delay corresponding to the product of the relatively high parasitic capacitance coupled to the non-inverted current output line IoT, the inverted current output line IoB and the feedback resistors constituting the current-voltage converter may cause undesirable oscillation. In order to prevent this oscillation, the operational amplifier having a relatively wide band must restrict the low power consumption of the D/A converter.

On the other hand, the aforementioned offset adjustor is effected in the prior art for a single output signal, but is not considered where the output offsets of the electronic circuit, having a plurality of analog signal outputs, have to be precisely adjusted, as in the case where two positive and negative symmetric analog signals are to be outputted from one D/A converter through a non-inverted amplifier and an inverted amplifier, or in the case where analog signals having different phases of 90 degrees are to be simultaneously outputted from a plurality of D/A converters.

An object of the present invention is to realize a highly precise current drive type D/A converter having a reduced layout area and power consumption.

Another object of the present invention is to promote the reductions of the size, power consumption and cost of a portable communication terminal unit using the current drive type D/A converter.

Still another object of the present invention is to provide a circuit capable of adjusting the output offset of an electronic circuit having a plurality of precise analog signal outputs.

A further object of the present invention is to provide a circuit which includes a D/A converter realized by a semiconductor integrated circuit with a view to establishing a low voltage power source and reducing the power consumption and which can adjust the output offset of an electronic circuit having a plurality of stable and precise analog signal outputs relatively.

A further object of the present invention is to provide a portable communication terminal unit which has a low power consumption by using such offset adjusting circuit.

The aforementioned and other objects and novel features of the present invention will become apparent from the description to be made with reference to the accompanying drawings.

An embodiment of the invention to be disclosed herein will be briefly summarized in the following. Specifically, the current drive type D/A converter to be packaged in the portable communication terminal unit is basically constructed of a plurality of unit D/A converters coupled in series or in parallel through corresponding current attenuators or current amplifiers, for individually converting digital signals into analog currents. The current sources to be used in the unit D/A converters are constructed of identical unit current sources. According to this embodiment, the number of current sources and switches required for each unit D/A converter having one unit current source and one switch of minimum size, can be drastically reduced. Thus, it is possible to reduce the necessary layout area of the D/A converter and to reduce the parasitic capacitance of the switch MOSFETs coupled to the current output lines thereby reducing the power consumption. As a result, it is possible to reduce of the size, power consumption and cost of the portable communication terminal unit using the D/A converter.

Another embodiment of the invention to be disclosed herein will be briefly summarized in the following. Specifically, prior to the application of an actual input signal to the D/A converter, a fixed digital signal corresponding to a reference DC signal is inputted to produce output offsets. The individual offsets of a plurality of analog output signals, obtained by branching the outputs of the D/A converter and having a phase difference of about 180 degrees in positive and opposite phases, are detected. After this, at least one offset adjusting negative feedback signals for setting the DC offset value of the individual analog outputs to a desired value, is exemplified by the digital signal to fed back to the input portion of the D/A converter. At least another negative feedback signal is exemplified by the analog signal obtained by branching the output of the D/A converter and feeding back to the path portions.

Such offset adjustor is constructed to include: the switch means for selecting and outputting a plurality of analog signals to adjust their offsets; the comparison means for comparing the output of the switch means and the reference potential for the offset detection; the detection means for detecting the inversion of the output polarity of the comparison means; the counting means for performing a series of counting operations until the inversion of the output polarity of the comparison means in the initial state of the counted value is detected by the detection means; the plurality of memory means made receptive to the output of the counting means and disposed individually for the offset adjusted negative feedback signals; the D/A conversion means for converting the output of the memory means corresponding to the offset adjusted negative feedback signal from a digital signal to an analog signal; and the timing generating means for utilizing the single comparison means in a time sharing manner by selecting the analog signal by the switch means and selecting the memory means for latching the output of the counting means sequentially for every offset adjusted negative feedback signal.

The comparison means includes the differential amplifier for receiving the output of the switch means and the reference voltage for the offset detection, and the output for receiving the single end output from the differential amplifier, so that the constant current transistors of the differential amplifier and the constant current transistors of the output are fed with the bias voltages of the different bias voltage feed paths.

The portable communication terminal unit including the transmitting unit or the transmitting/receiving unit, and the offset adjustor for adjusting the offsets of the circuits contained in the transmitting unit or the transmitting/receiving unit, further includes the control means for activating all the circuits composing the offset adjustor for: a predetermined time period after the power is supplied to the portable communication terminal unit and before the generation of the offset adjusted negative feedback signal by the offset adjustor is fixed, and a predetermined time period after the transmitting unit or the transmitting/receiving unit of the portable communication terminal unit or a portion of the circuits contained therein are brought from the standby state for no communication to the communication state, and before the generation of the offset adjusted negative feedback signal by the offset adjustor is fixed. Thereafter the control means activate the plurality of memory means and the D/A converter of the aforementioned circuit to maintain the generation of the fixed offset adjusted negative feedback signal. Lastly, the control circuit inactivates all the circuits composing the offset adjustor when in the standby state.

According to the aforementioned means, the offset adjusted negative feedback signal is composed of: the digital signal to be negatively fed back to the path of the D/A converter input and the analog signal to be negatively fed back to the system which is branched midway from the system having its offset adjusted by the offset adjusted negative feedback signal acting as the aforementioned digital signal. As a result, the offsets of the plurality of analog output signals obtained by branching the output of the D/A converter, having different phases, can be detected and adjusted independently and highly precisely by the reduced circuit construction.

By utilizing the single comparison means in a time sharing manner, it is possible to minimize not only the dispersion of the offsets adjusted between the plurality of analog signals to have their offsets cancelled, but also the circuit construction for canceling the offset of the comparison means itself, thus contributing to the simplification of the circuit construction for the offset adjustment.

By adopting the voltage comparing means for separating the bias voltages of the constant current transistors contained in the differential amplifier and the bias voltages of the constant current transistors contained in the output, the fluctuation of the bias voltages due to the high fluctuation of the potential of the output is enabled to exert no influence upon the differential amplifier and to feed a constant current to the differential amplifier at all times so that a precise decision can be realized.

All the circuits composing the offset adjustor are operated when the power is supplied and when the standby is released. Only the memory means for feeding the offset adjusted negative feedback signals and the auxiliary D/A converter are held operative during the communication after the offset detection has ended, leaving the other circuit portions inactive. As a result, the phase modulating/demodulating unit and the portable communication terminal unit having the former packaged therein, have their power consumption reduced and optimized for battery drive.

BRIEF DESCRIPTION OF THE DRAWINGS

FIG. 2 is a truth table showing one embodiment of a thermometer coder included in the D/A converter of FIG. 1;

DESCRIPTION OF THE PREFERRED EMBODIMENTS

Figure 1:
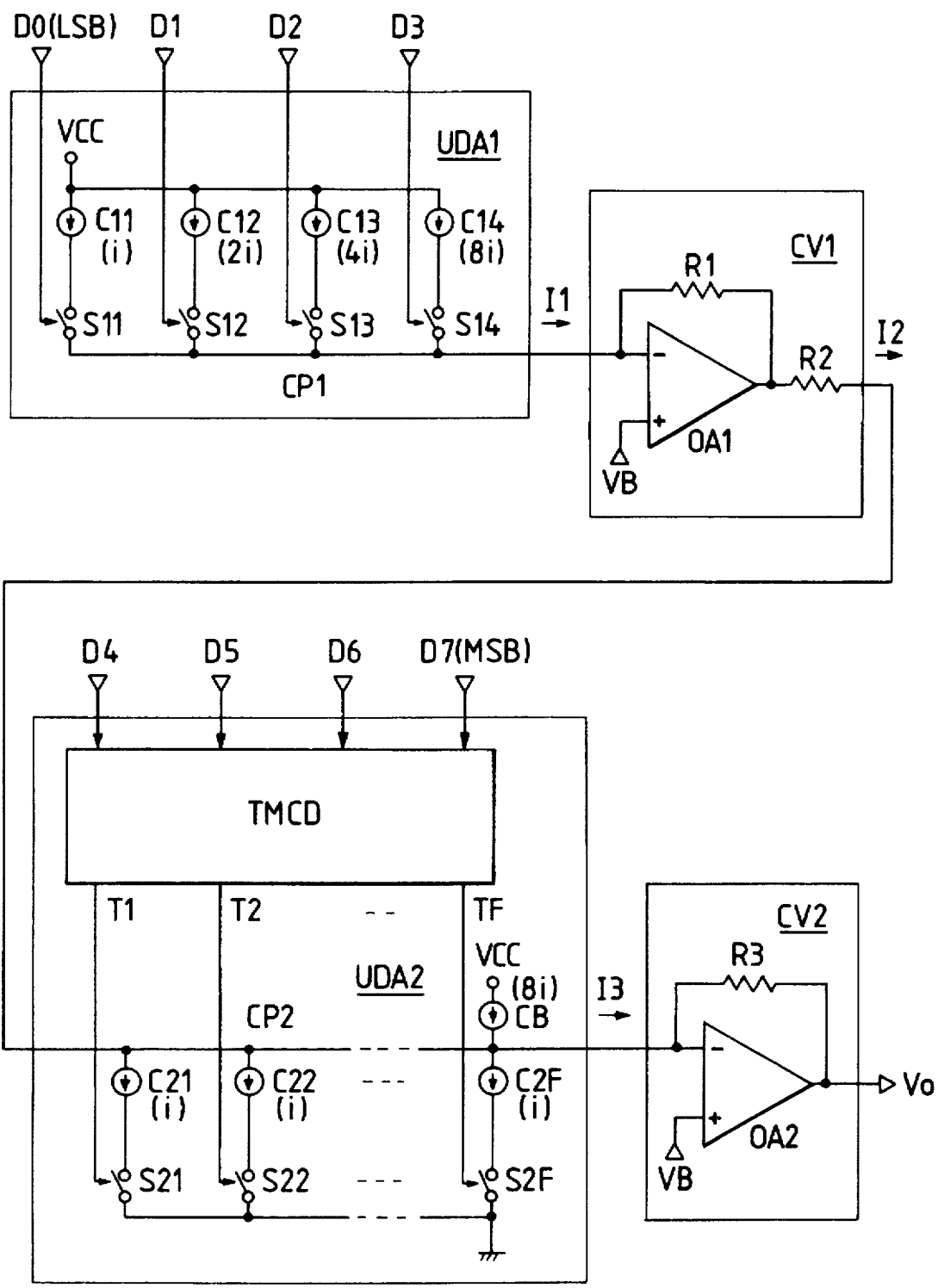
FIG. 1 is a circuit diagram showing a first embodiment of a D/A converters to which is applied the present invention.
Figure 3:
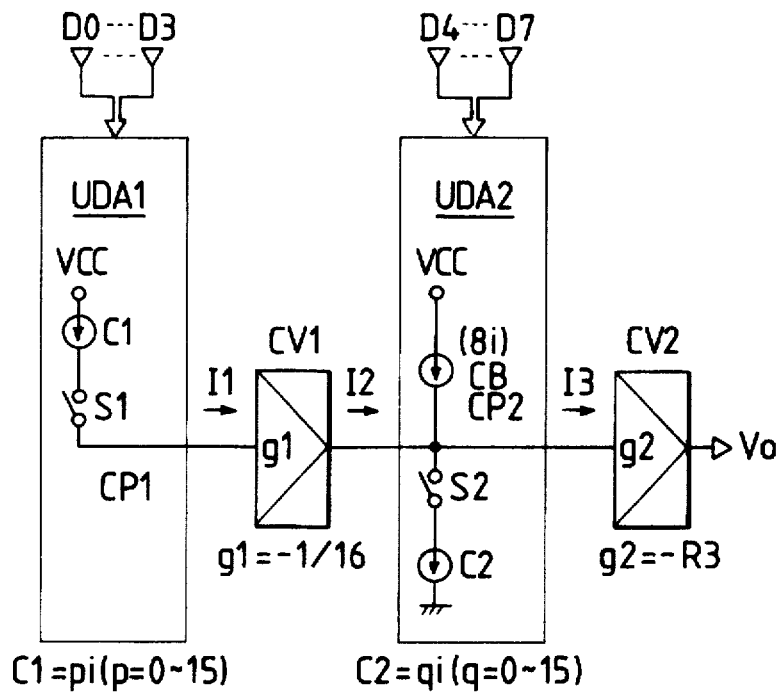
FIG. 3 is an equivalent circuit diagram showing one embodiment of the D/A converter of FIG. 1.

FIG. 1 is a circuit diagram showing a first embodiment of a D/A converter, to which is applied the present invention. FIG. 2 is a truth table showing one embodiment of a thermometer coder included in the D/A converter of FIG. 1. FIG. 3 is an equivalent circuit diagram showing one embodiment of the D/A converter of FIG. 1. With reference to these Figures, the construction, operations and features of the D/A converter according to the present invention will be described.

The D/A converter of the present invention is packaged in a portable communication terminal unit, although not especially limited thereto. The individual circuit elements of FIG. 1 are formed, together with other predetermined circuit elements composing a portable communication terminal unit, over a single semiconductor substrate made of monocrystalline silicon or the like. In the following circuit diagrams, all the currents at the individual nodes are unified into identical directions but may actually have directions different from that shown. In the following numerical equations for determining the current values, therefore, the currents are indicated by "+" signs, if they flow in the direction of allows of the circuit diagrams, but otherwise by "−" signs.

In FIG. 1, the D/A converter of this embodiment is equipped with D/A converters identified as UDA1 through UDA2, and two current converters CV1 and CV2 corresponding to the unit D/A converters. Of these, the unit D/A converter UDA1 is fed with 4-bit digital signals D0 to D3 containing the least significant bits (LSB) produced by a preceding circuit (not shown) of the portable communication terminal unit, whereas the unit D/A converter UDA2 is fed with 4-bit digital signals D4 to D7 containing the most significant bits (MSB).

Here, the unit D/A converter UDA1 includes: four current sources C11 to C14 commonly coupled at their ends to a supply voltage VCC and switches S11 to S14 connected between the other supply sources and a current output line CP1. In this embodiment, the supply voltage VCC is set to a relatively small absolute value such as +3.0 V. Moreover, the current source C11 and the current sources C12 to C14 are respectively composed of MOSFETs (i.e., Metal Oxide Semiconductor Field Effect Transistors), which are designed to predetermined sizes for feeding unit currents i, 2i, 4i and 8i, respectively, according to the weights of the digital signals. The switches S11 and S14 are composed of MOSFETs which are given predetermined sizes corresponding to the current values of the corresponding current sources C11 to C14 and which are selectively turned ON when the corresponding digital signals D0 to D3 are set to high.

The current sources C11 to C14 (as exemplified by a current source C1 in FIG. 3) are selectively validated, when the corresponding switches S11 to S14 (as exemplified by a switch S1 in FIG. 3) are turned ON, that is, when the corresponding digital signals D0 to D3 are set high, to feed the current output line CP1 with an analog current I1 corresponding to the summed current value in the direction of arrow. The value of the current of the current source C1, i.e., the current I1, is expressed as a decimal value p of the digital signals D0 to D3 so that it takes values of 0 to 15i for the unit current i:

$$C1 = pi.$$

On the other hand, the unit D/A converter UDA2 includes: a thermometer coder TMCD which receives the digital signals D4 to D7 for selectively setting its output signals T1 to TF to high; a bias current source CB connected between the supply voltage VCC and a current output line CP2; and fifteen current sources C21 to C2F commonly coupled at end to the current output line CP2. These current sources C21 to C2F are coupled at their other end to ground through corresponding switches S21 and S2F. The current sources C21 to C2F are composed of MOSFETs which are designed to predetermined sizes for feeding the same unit current i as that of the current source C11 of the aforementioned unit D/A converter UDA1. The switches S21 to S2F are composed of MOSFETs which are given predetermined sizes corresponding to the current values of those current sources and which are selectively turned ON when the corresponding output signals T1 to TF of the thermometer coder TMCD are set high.

The aforementioned bias current source CB is composed of a MOSFET which has a predetermined size for feeding a bias current of the (4−1) power of 2 of the unit current i, i.e., 8i in the direction of the arrow if the digital signals D4 to D7 have a bit number 4. Incidentally, the components such as the output signals T1 to Tf of the thermometer coder TMCD, the current sources C21 to C2F or the switches S21 to S2F are expressed using hexadecimal numbers.

The output signals T1 to TF of the aforementioned thermometer coder TMCD take values in accordance with the digital signals D4 to D7, as shown in FIG. 2. Specifically, all the output signals T1 to TF are set to low, i.e., the logic "0" when the digital signals D4 to D7 are expressed by "0000", that is, when the decimal value q is 0. The output signal T1 is set to the logic "1" when the digital signals are expressed by "0001" or the decimal value q is 1. All the output signal T1 to TF are set to the logic "1" when the digital signals are expressed by "1111" or the decimal value q is 15.

As a result, the current sources C21 to C2F (as exemplified by a current source C2 in FIG. 3) are selectively validated, when the corresponding switches S21 to S2F (as exemplified by a switch S2 in FIG. 3) are turned ON, that is, when the corresponding output signals T1 to TF of the thermometer coder TMCD are set to high, to extract the analog current corresponding to the summed current value from the current output line CP2 in the opposite direction of arrow. The current value C2 is expressed by the decimal value q of the corresponding digital signals D4 to D7 so that it takes values of 0 to 15i where i is unit current:

$$C2 = qi.$$

The current converter CV1 includes an operational amplifier OA1 and a feedback resistor R1 connected between the inverted input terminal '−' and the output terminal. This operational amplifier OA1 has its inverted input terminal '−' coupled to the current output line CP1 of the unit D/A converter UDA1 and its output terminal coupled through an output resistor R2 to the current output line CP2 of the unit D/A converter UDA2. The non-inverted input terminal '+' of the operational amplifier is fed with a predetermined bias voltage VB. In this embodiment, the bias voltage VB is set to an intermediate potential between the supply voltage VCC and ground, i.e., +1.5 V, although not especially limited thereto. As a result, the unit D/A converter UDA1 is coupled in series to the succeeding unit D/A converter UDA2 through the corresponding current converter CV1, and the inverted input terminal '−' of the operational amplifier is virtually grounded to the aforementioned bias voltage VB.

On the other hand, the current converter CV2 includes an operational amplifier OA2 and a feedback resistor R3 connected between the inverted input terminal '−' and the output terminal of that operational amplifier OA2. This operational amplifier OA2 has its inverted input terminal '−' coupled to the current output line CP2 of the unit D/A converter UDA2, and its non-inverted input terminal '+' is connected to bias voltage VB. As a result, the inverted input terminal '−' of the operational amplifier OA2 is virtually grounded to the bias voltage VB. Moreover, since this operational amplifier OA2 has its inverted input terminal '−' virtually grounded to the bias voltage VB, the current converter CV1 also has its output terminal, i.e., current output line CP2 virtually grounded to the bias voltage VB.

As a result, the current converter CV1 acts as an inverted output type current converter having the following gain g1:

$$g1 = -R1/R2.$$

In this embodiment, the resistance R1 of the feedback resistor R1 is set to satisfy the following relation:

$R1=R2/16.$

As a result, the current converter CV1 has the following gain g1:

$$gi=-1/16$$

Specifically, the current converter CV1 acts as a current attenuator with an attenuation factor corresponding to the minus fourth power of 2 of the bit number 4 of the digital signals D4 to D7 fed to the succeeding unit D/A converter UDA2, to extract the following current I2 in the opposite direction to the arrow from the current output line CP2 of the unit D/A converter UDA2:

$$I2=-I1/16=-pi/16$$

The current converter CV2 acts as an inverted output type current/voltage converter having a gain of $g2=-R3$ and outputs an analog output voltage Vo as follows:

$$Vo=VB-R3\times I3.$$

As described above, line CP2 of the unit D/A converter UDA2 is fed with the following analog current I2 from the unit D/A converter UDA1 through the current converter CV1:

$$I2=-pi/16.$$

The current output line CP2 is further fed with the following analog current C2 in the opposite direction of the arrow by the current source C2, sources C21 to C2F:

$$C2=qi.$$

The current output line CP2 is further fed with the following bias current CB in the direction of the arrow by the bias current source CB:

$$CB=8i.$$

As a result, the analog current I3 at the output node of the unit D/A converter UDA2 has the following value I3:

$$I3=-C2+I2+CB=-(q+p/16-8)i.$$

The analog output voltage Vo at the output terminal of the D/A converter is expressed by the following equation:

$$Vo=VI+g2\times I3=VB+R3(q+p/16-8)i.$$

The analog output value Vo is a function of the decimal values q and p of the digital signals D0 to D7 and is biased by the bias voltage VB and has the unit current i as a coefficient.

In the D/A converter of this embodiment, both the unit D/A converters UDA1 and UDA2 made receptive of the digital signals of different weights are composed of current sources C11 to C14 and C21 to C2F, unit current sources for feeding the equal unit current i and are coupled in series to each other through the current attenuator, i.e., the current converter CV1 having the attenuation factor of 1/16 so that they can function as the D/A converters for producing the analog output voltage Vo corresponding to the binary values of the 8-bit digital signals D0 to D7.

Figure 15:
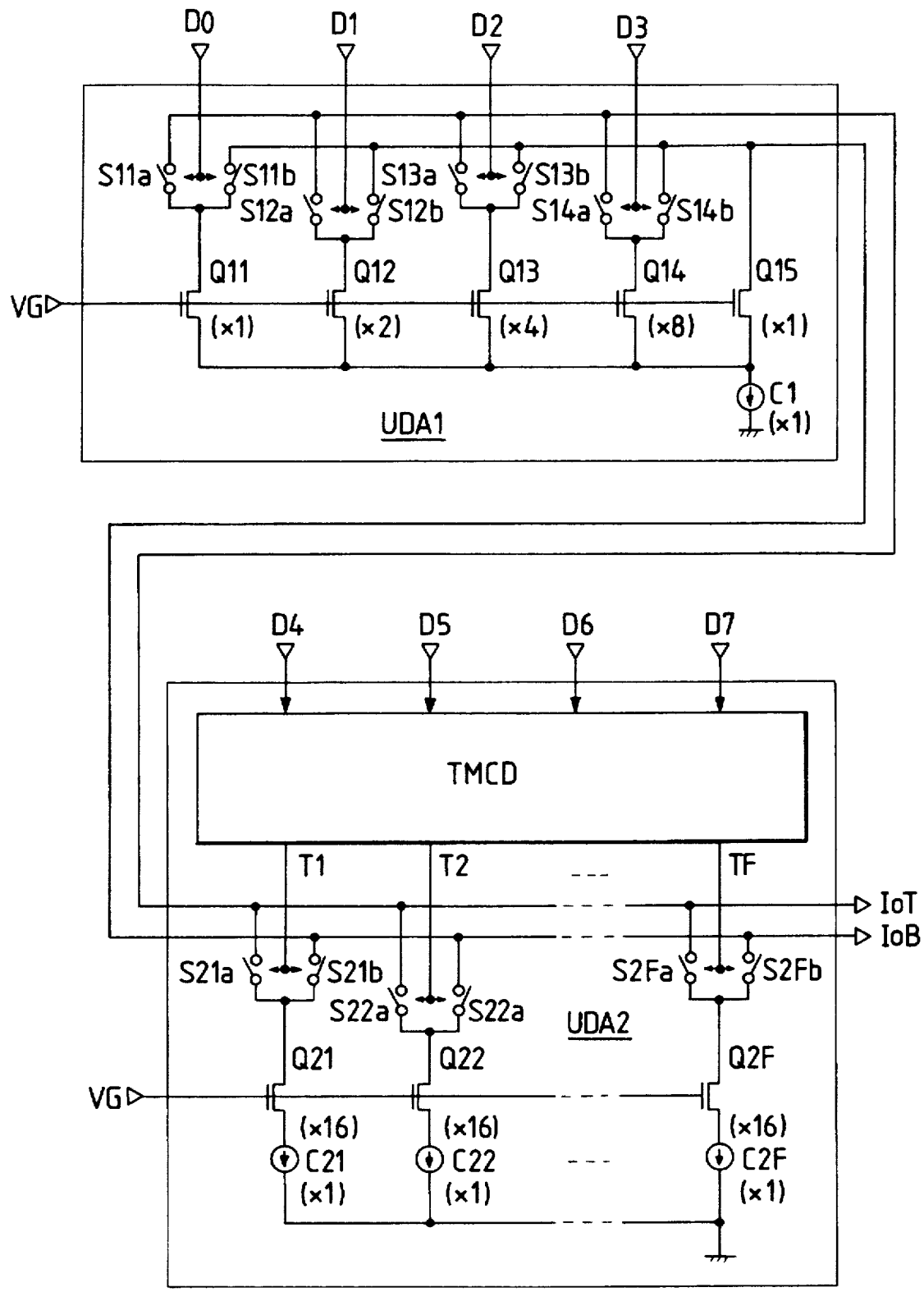
FIG. 15 is a circuit diagram showing one example of the D/A converter adopting the current drive type.

As has been clarified by the description made above, if the current source for feeding the unit current i is one in number, the number of the current sources required in the D/A converter is increased to 38 although sixteen current sources are required in the example of FIG. 15. Where, however, the number of the current dividing MOSFETs for retaining the current accuracy are compared, they are reduced from 255 to 37, and the number of switches necessary for one switch S11 of minimum size is also reduced from 255 to 30, so that the switch MOSFETs coupled to the current output lines CP1 and CP2 have their parasitic capacitance accordingly reduced. As a result, it is possible to drastically reduce the integrated circuit area necessary for the D/A converter and to reduce the power consumption of the D/A converter by suppressing the phase delay which is caused by the parasitic capacitance coupled to the current output lines CP1 and CP2 and the feedback resistors R1 and R2 of the operational amplifiers OA1 and OA2, Thus, it is possible to promote the reductions in the size and power consumption of the portable communication terminal unit including the D/A converter.

Now, the analog output voltage Vo outputted from the D/A converter takes the following maximum Vomax for $q=p=15$ and the following minimum Vomin for $q=p=0$:

$$Vomax=VB+R3(7+15/16)i;$$

and $$Vomin=VB-R3\times 8i.$$

The analog output voltage Vo takes the following central value Vocen for $q=8$ and $p=0$:

$$Vocen=VB.$$

As described above, the bias voltage VB takes an intermediate potential, i.e., +1.5 V, between the supply voltage VCC or the operating power source of the D/A converter and ground. In this embodiment, the aforementioned analog output voltage Vo has its maximum Vomax set to a value slightly lower than the supply voltage VCC and its minimum Vomin set to a value slightly higher than the ground potential of the circuit. As a result, the analog output signal Vo can be swung fully within the operating power source range of the D/A converter to achieve a sufficient signal amplitude.

As in the following embodiment, either by setting the current value of the bias current source CB, for example, to:

$$CB=(7+31/32)i,$$

or by connecting a current source for fixedly feeding the following current CC, in parallel with the current source C1, i.e., the current sources C11 to C14 and the switch S1, i.e., the switches S11 to S14 of the unit D/A converter UDA1:

$$CC=i/2,$$

the absolute value Vomin, (the absolute value of the minimum Vomin of the analog output voltage Vo is and will be designated by Vomin*) of the minimum of the analog output voltage Vo and the absolute value Vomax of the maximum of the same can be set to the following identical value:

$$Vomin^*=Vomax^*=R3(7+31/32)i.$$

Figure 4:
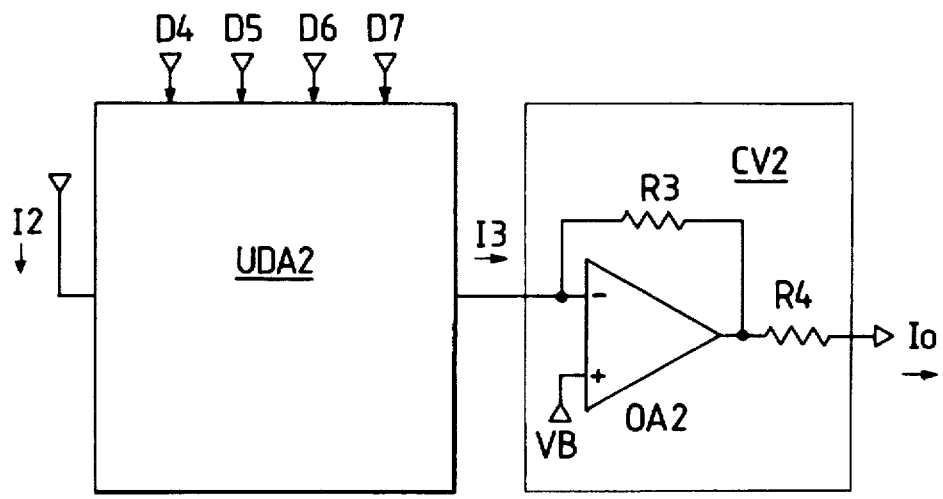
FIG. 4 is a partial circuit diagram showing a second embodiment of the D/A converter, to which is applied the present invention.
Figure 5:
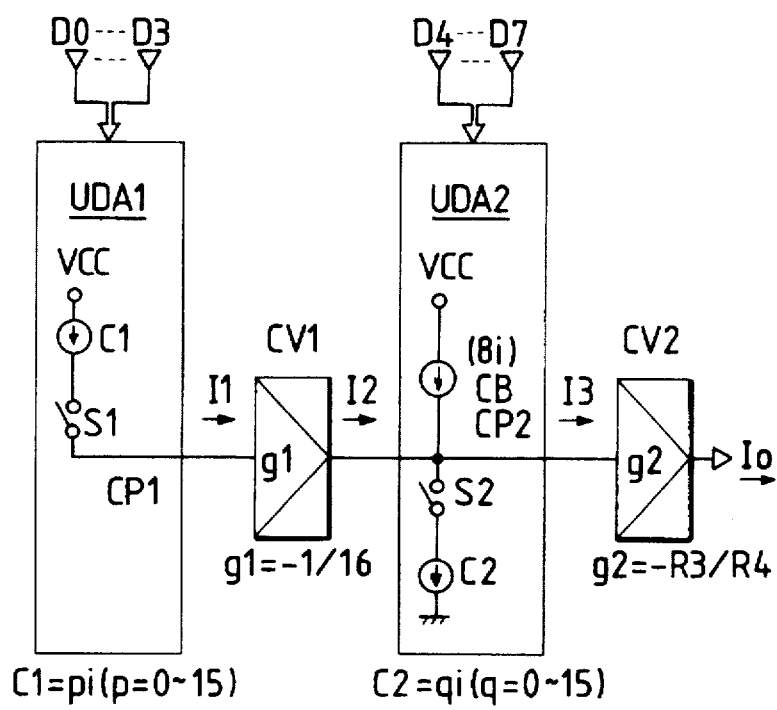
FIG. 5 is an equivalent circuit diagram showing one embodiment of the D/A converter of FIG. 4.

FIG. 4 is a partial circuit diagram showing a second embodiment of the D/A converter, to which is applied the present invention, and FIG. 5 equivalent circuit diagram of the same. Incidentally, since the D/A converter of this embodiment basically follows the foregoing embodiment of FIGS. 1 to 3, the description to be added is directed exclusively to the portions different therefrom.

In FIG. 4, the D/A converter of this embodiment includes the current converter CV2 having the operational amplifier OA2, and the feedback resistor R3 connected between the inverted input terminal '−' of the operational amplifier OA2 and the output terminal. The operational amplifier OA2 has its inverted input terminal '−' coupled to the current output line CP2 of the unit D/A converter UDA2 and its non-inverted input terminal '+' connected bias voltage VB.

In this embodiment, the output terminal of the operational amplifier OA2 is coupled to the output terminal of the D/A converter through an output resistor R4. The output terminal of the D/A converter is coupled to the succeeding circuit (not shown) of the portable communication terminal unit having an input portion set to the bias voltage VB. As a result, current converter CV2 acts as the current attenuator or amplifier having the gain g2, as shown in FIG. 5, and feeds the output current Io to the succeeding circuit from its output terminal where:

$$g2=-R3/R4;$$

and $$Io=g2 \times I3=-R3 \times I3/R4.$$

In short, the D/A converter of this embodiment can output its analog output signal as a current signal. This analog output current Io has the following value in view of the embodiment of FIGS. 1 to 3:

$$Io=R3(q+p/16-8)i/R4.$$

Figure 6:
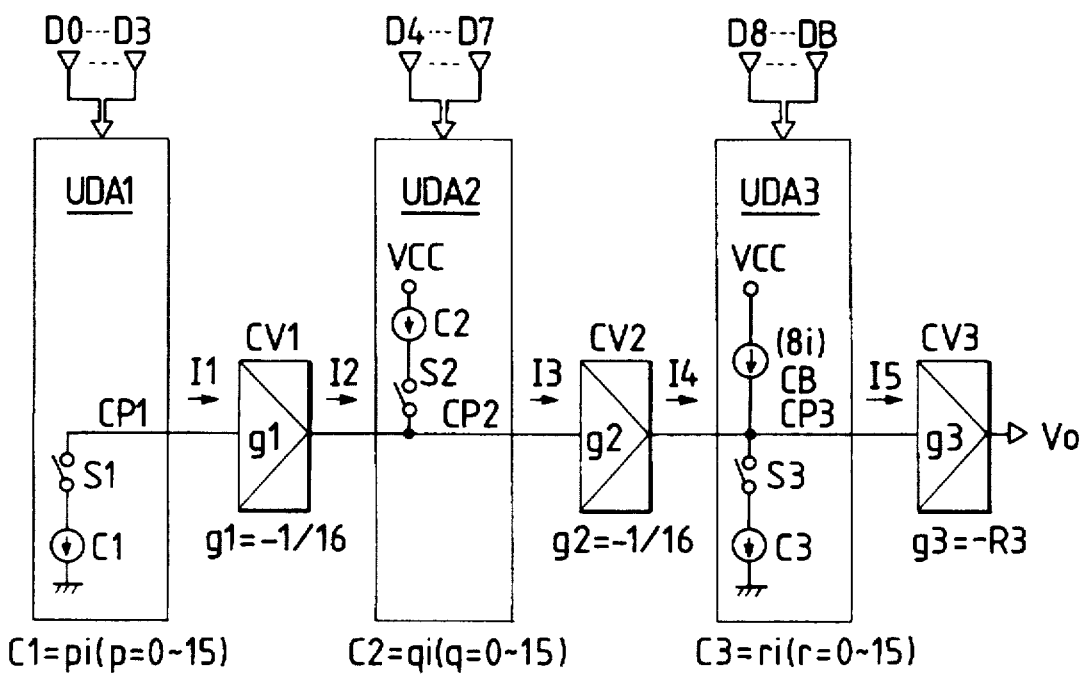
FIG. 6 is an equivalent circuit diagram showing a third embodiment of the D/A converter, to which is applied the present invention.

FIG. 6 is an equivalent circuit diagram showing a third embodiment of the D/A converter, to which is applied the present invention. Incidentally, since the D/A converter of this embodiment basically follows the foregoing embodiment of FIGS. 1 to 3, the description to be added is directed exclusively to the portions different therefrom.

In FIG. 6, the D/A converter of this embodiment is constructed to include three unit D/A converters UDA1 to UDA3 coupled in the in series through the current converters CV1 and CV2, and another current converter CV3 disposed at the output side of the unit D/A converter UDA3. Of these, the unit D/A converter UDA1 includes the switch S1 and the current source C1 connected in series between the current output line CP1 and the ground potential of the circuit. The unit D/A converter UDA2 includes the current source C2 and the switch S2 connected in series between the supply voltage VCC and the current output line CP2.

The unit D/A converter UDA3 is constructed to include: the bias current source CB connected between the supply voltage VCC and the current output line CP3, a switch S3, and a current source C3 connected in series between the current output line CP3 and the ground potential of the circuit. The unit D/A converter UDA1 is fed with the 4-bit digital signals D0 to D3 from the preceding circuit (not shown) of the portable communication terminal unit, and the unit D/A converters UDA2 and UDA3 are respectively fed with the 4-bit digital signals D4 to D7 and the 4-bit digital signals D8 to DB.

The current sources C1 to C3 of the aforementioned unit D/A converters UDA1 to UDA3, are individually composed of four current sources for feeding electric currents i, 2i, 4i and 8i, respectively, and that the switches S1 to S3 are individually composed of four or fifteen switches to be selectively turned ON in response to output signals T1 to TF of the thermometer coder, which correspond to digital signals D0 to D3, D4 to D7 or D8 to DB.

In this embodiment, the current converter CV1 is an inverted output type current attenuator which has an attenuation factor g1 determined by the minus n2-th power of 2 (wherein n2 is the bit number 4 of the digital signals D4 to D7 to be fed to the succeeding unit D/A converter UDA2):

$$g1=-1/16.$$

The current converter CV2 is an inverted output type current attenuator which has an attenuation factor g2 by the minus nm-th power of 2 (wherein the nm is the bit number 4 of the digital signals D8 to DB to be fed to the succeeding unit D/A converter UDA3):

$$g2=-1/16.$$

Moreover, the current converter CV3 is an inverted output type current-voltage converter which has a gain g3 determined by the following:

$$g3=-R3.$$

From these results, the current value I1 of the analog current I1 at the output node of the unit D/A converter UDA1 takes the following:

$$I1=-C1=-pi,$$

and the analog current I2 at the output node of the current converter CV1 takes the following:

$$I2=g1 \times I1=pi/16.$$

On the other hand, the current value I3 of the analog current I3 at the output node of the unit D/A converter UDA2 takes the following:

$$I3=C2+I2=(q+p/16)i,$$

and the analog current I4 at the output node of the current converter CV2 takes the following value:

$$I4=g2 \times I3=-(q+p/16)i/16.$$

Moreover, the current value I5 of the analog current I5 at the output node of the D/A converter UDA3 takes the following:

$$\begin{aligned} I5 &= -C3 + I4 + CB \\ &= -(r + q/16 + p/256 - 8)i \end{aligned},$$

and the potential Vo of the analog output voltage Vo at the output node of the current converter CV3, i.e., the D/A converter, takes the following value so that it is biased by the bias voltage VB and becomes a function of the binary values rs q and p of the digital signals D0 to DB having unit current i as the coefficient:

$$\begin{aligned} Vo &= VB + g3 \times I5 \\ &= VB + R3(r + q/16 + p/256 - 8)i \end{aligned}$$

The analog output voltage Vo to be outputted from the D/A converter of this embodiment takes the following maximum Vomax for r=q=p=15 and the following minimum Vomin for r=q=p=0:

$$Vomax=VB+R3(7+15/16+15/256)i;$$

and $$Vomin=VB-R3 \times 8i.$$

And, the analog output voltage Vo takes the following central value Vocen for r=8 and q=p=0:

$$Vocen=VB.$$

The D/A converter of this embodiment can be so constructed so that the current sources of the unit D/A converters are the unit current sources for feeding the common unit current i. Thus, the D/A converter can reduce the necessary layout area and the power consumption more than the foregoing embodiment of FIGS. 1 to 3.

In the foregoing first three embodiments, the current directions of the current sources of the individual unit D/A converters, are sequentially alternated into the opposite directions. This means, as is apparent from the corresponding formulas, that the final value of the analog voltage or analog current can be determined merely by adding the analog currents of the individual unit D/A converters in accordance with the attenuation factors of the corresponding current converters. In other words, the final value can be determined without knowledge of the logic levels of the digital signals to be fed to the individual unit D/A converters.

Figure 7:
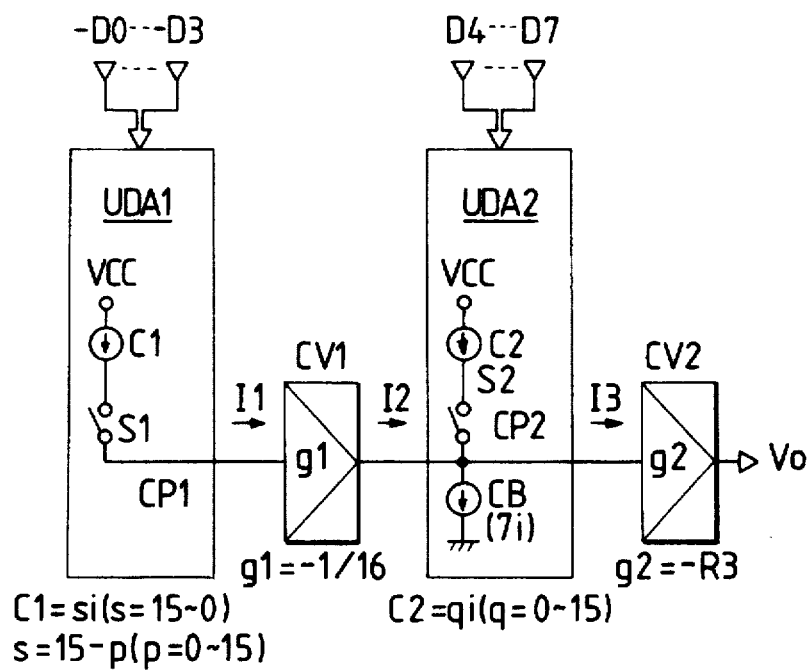
FIG. 7 is an equivalent circuit diagram showing a fourth embodiment of the D/A converter, to which is applied the present invention.

FIG. 7 is an equivalent circuit diagram showing a fourth embodiment of the D/A converter, to which is applied the present invention. Incidentally, since the D/A converter of this embodiment basically follows the foregoing embodiment of FIGS. 1 to 3, the description to be added is directed exclusively to the portions different therefrom.

In FIG. 7, the D/A converter of this embodiment is constructed to include D/A converters UDA1 and UDA2 coupled in series through the current converter CV1. Current converter CV2 is disposed at the output side of the unit D/A converter UDA2. Of theses the unit D/A converter UDA1 includes the current source C1 and the switch S1 connected in series between the supply voltage VCC and the current output line CP1. The unit D/A converter UDA2 includes the current source C2, the switch S2 connected in series between the supply voltage VCC and the current output line CP2; and the bias current source CB connected between the current output line CP2 and the ground potential of the circuit.

The unit D/A converter UDA1 is fed with the 4-bit inverted digital signals $-D0$ to $-D3$ from the preceding circuit (not shown) of the portable communication terminal unit. The unit D/A converter UDA2 is fed with the 4-bit digital signals D4 to D7.

The inverted digital signals $-D0$ to $-D3$ to be fed to the unit D/A converter UDA1 are digital signals D0 to D3 inverted. Decimal value s has the following relation to the decimal value p of the digital signals D0 to D3:

$$s=15-p$$

In this embodiment, the current value of the bias current source CB included in the unit D/A converter UDA2 is set to 7i, i.e., the $\{(4-1) \text{ power of } 2-1\}$ times the unit current i of the bit number 4 of the digital signals D4 to D7 fed to the unit D/A converter UDA2. Moreover, the current converter CV1 is an inverted output type current attenuator which has an attenuation factor g1 determined by the minus 4 power of 2 of the bit number 4 of the digital signals D4 to D7 to be fed to the succeeding unit D/A converter UDA2. Moreover, the current converter CV2 is an inverted output type current attenuator which has a gain g2 determined by the following:

$$g2=-R3.$$

From these results, the current value I1 of the analog current I1 at the output node of the unit D/A converter UDA1 takes the following:

$$I1=C1=si=(15-p)i,$$

and the analog current I2 at the output node of the current converter CV1 takes the following:

$$I2=g1\times I1=-(15-p)i/16.$$

On the other hand, the current value I3 of the analog current I3 at the output node of the unit D/A converter UDA2 takes the following:

$$I3=C2+I2-CB=(q+p/16-7-15/16)i,$$

and the potential Vo of the analog output voltage Vo at the output node of the current converter the D/A converter, takes the following value so that it is biased by the bias voltage VB and becomes a function of the decimal values q and p of the digital signals D0 to D7 having the unit current i as the coefficient:

$$\begin{aligned} Vo &= VB + g2 \times I3 \\ &= VB - R3(q+p/16-7-15/16)i \end{aligned}$$

The analog output voltage Vo to be outputted from the D/A converter of this embodiment takes the following maximum Vomax for $q=p=0$ and the following minimum Vomin for $q=p=15$:

$$Vomax=VB+R3(7+15/16)i;$$

and $$Vomin=VB-R3\times 8i.$$

And, the analog output voltage Vo takes the following central value Vocen for $q=7$ and $p=15$:

$$Vocen=VB.$$

Figure 8:
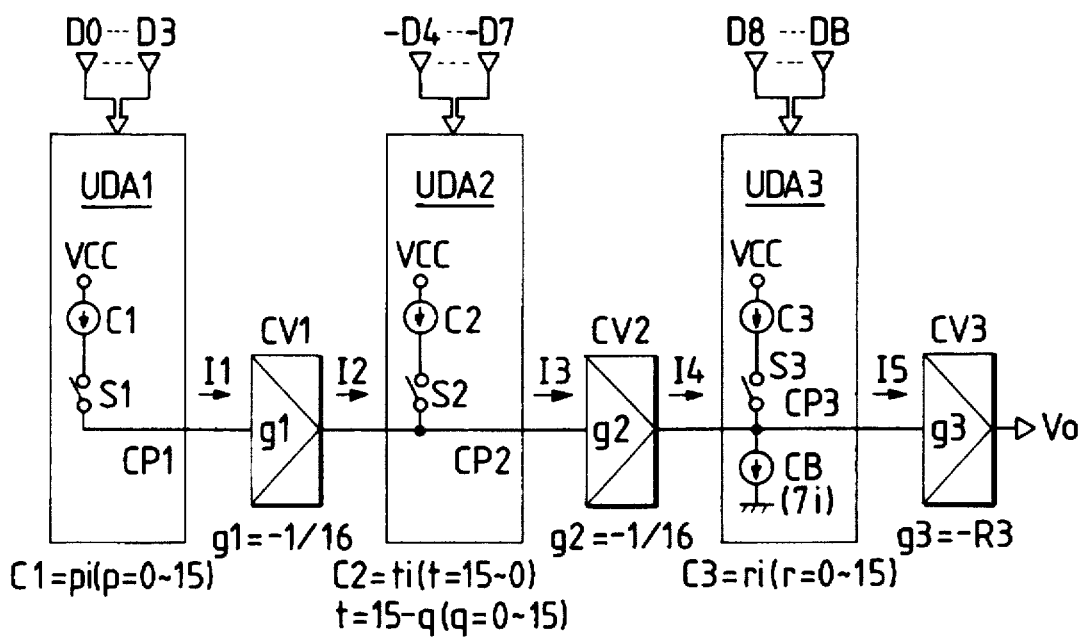
FIG. 8 is an equivalent circuit diagram showing a fifth embodiment of the D/A converter, to which is applied the present invention.

FIG. 8 is an equivalent circuit diagram showing a fifth embodiment of the D/A converter, to which is applied the present invention. Incidentally, since the D/A converter of this embodiment basically follows the foregoing embodiments of FIGS. 1 to 3 and FIG. 7, the description to be added is directed exclusively to the portions different therefrom.

In FIG. 8, the D/A converter of this embodiment is constructed to include D/A converters UDA1 to UDA3 coupled in series through the current converters CV1 and CV2. Another current converter CV3 is disposed at the output side of the unit D/A converter UDA3. Of these, the unit D/A converter UDA1 includes the current source C1 and the switch S1 connected in series between supply voltage VCC and the current output line CP1. The unit D/A converter UDA2 includes the current source C2 and the switch S2 connected in series between the supply voltage VCC and the current output line CP2.

The unit D/A converter UDA3 is constructed to include the current source C3 and the switch S3 connected in series between the supply voltage VCC and the current output line CP3, and the bias current source CB connected between the current output line CP3 and the ground potential of the circuit. The unit D/A converter UDA1 is fed with the 4-bit digital signals D0 to D3 from the preceding circuit (not shown) of the portable communication terminal unit. The unit D/A converters UDA2 and UDA3 are respectively fed with the 4-bit digital signals $-D4$ to $-D7$ and the 4-bit digital signals D8 to DB.

The inverted digital signals $-D4$ to $-D7$ to be fed to the unit D/A converter UDA2 are digital signals D4 to D7 inverted. Their decimal value t has the following relation to the decimal value q of the digital signals D4 to D7:

$$t=15-q.$$

In this embodiment, the bias current source CB included in the unit D/A converter UDA3 is set to 7i, i.e., $\{(4-1)$ power of $2-1\}$ times the unit current i of the bit number 4 of the digital signals D8 to DB fed to the unit D/A converter UDA3. Moreover, the current converter CV1 is an inverted output type current attenuator which has its attenuation factor g1 determined by the minus fourth power of 2 of the bit number 4 of the digital signals −D4 to −D7:

$$g1=-1/16,$$

and the current converter CV2 is an inverted output type current attenuator which has an attenuation factor g2 determined by the minus fourth power of 2 of the bit number 4 of the digital signals D8 to DB:

$$g2=-1/16.$$

The current converter CV3 is an inverted output type current-voltage converter which has a gain g3 determined by the following:

$$g3=-R3.$$

From these results, analog current I1 at the output node of the unit D/A converter UDA1 takes the following:

$$I1=C1=pi,$$

and the analog current I2 at the output node of the current converter CV1 takes the following:

$$I2=g1\times I1=pi/16.$$

On the other hand, analog current I3 at the output node of the unit D/A converter UDA2 takes the following:

$$I3=C2+I2=-(q+p/16-15)i,$$

and the analog current I4 at the output node of the current converter CV2 takes the following:

$$I4=g2\times I3=(q+p/16-15)i/16.$$

Moreover, analog current I5 at the output node of the D/A converter UDA3 takes the following:

$$\begin{aligned}I5 &= -C3+I4+CB\\ &= -(r+q/16+p/256-7-15/16)i\end{aligned}$$

and the analog output voltage Vo at the output node of the current converter CV3, i.e., the D/A converter, takes the following so that it is biased by the bias voltage VB and becomes a function of the binary values r, q and p of the digital signals D0 to DB having the unit current i as the coefficient:

$$\begin{aligned}Vo &= VB+g3\times I5\\ &= VB-R3(r+q/16+p/256-7-15/16)i\end{aligned}$$

The analog output voltage Vo to be outputted from the D/A converter of this embodiment takes the following maximum Vomax for r=q=p=0 and the following minimum Vomin for r=q=p=15:

$$Vomax=VB+R3(7+15/16)i;$$

and $$Vomin=VB-R3\times(8+15/256)i.$$

And, the analog output voltage Vo takes the following central value Vocen for r=7, q=15 and p=0:

$$Vocen=VB.$$

In the foregoing first three embodiments, the directions of the currents from the current sources of the individual unit D/A converters are sequentially alternated into the opposite directions. In both the aforementioned fourth and fifth embodiments, however, the current directions are in the same direction from the supply voltage VCC to the individual current output lines. As a result, the predetermined-bit digital signals to be fed to the individual unit D/A converters are inverted and fed to every other unit D/A converters and correspond to the so-called "difference from the binary value 15".

In shorts in the foregoing first three embodiments, the current sources composing the individual unit D/A converters are sequentially connected in the alternating manner either between the supply voltage VCC and the individual current output line or between the individual current output line and the ground potential of the circuit. In the fourth and fifth embodiments, however, the current sources are connected between the supply voltage VCC and the individual current output line at all times. As a result, all the current values of the current sources composing the individual unit D/A converters can be easily and properly set with reference to the supply voltage VCC to promote more precision of the D/A converters.

Figure 9:
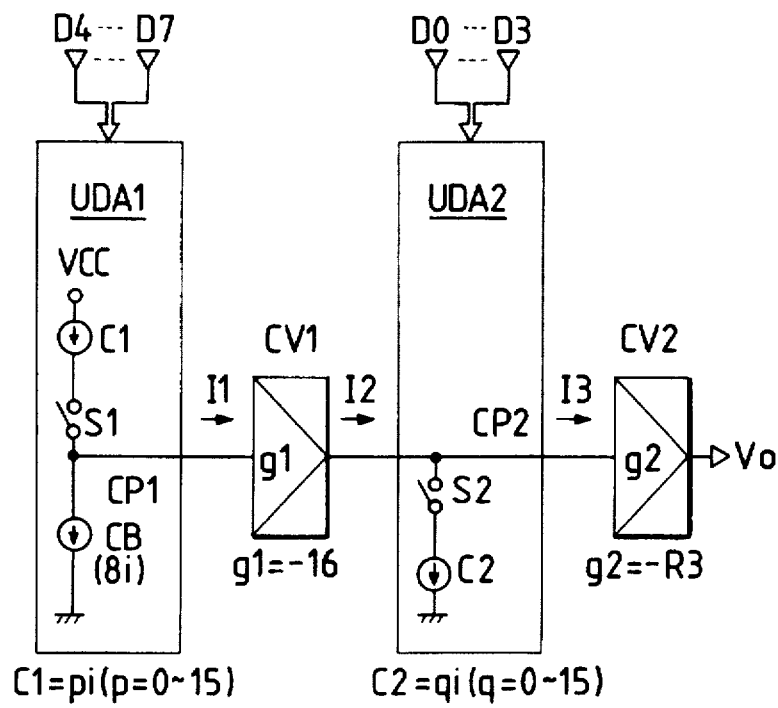
FIG. 9 is an equivalent circuit diagram showing a sixth embodiment of the D/A converter, to which is applied the present invention.

FIG. 9 is an equivalent circuit diagram showing a sixth embodiment of the D/A converter, to which is applied the present invention. Incidentally, since the D/A converter of this embodiment basically follows the foregoing embodiment of FIGS. 1 to 3, the description to be added is directed exclusively to the portions different therefrom.

In FIG. 9, the D/A converter of this embodiment is constructed to include two unit D/A converters UDA1 and UDA2 coupled in series through the current converter CV1. Another current converter CV2 is disposed at the output side of the unit D/A converter UDA2. Of these, the unit D/A converter UDA1 includes: the current source C1, the switch S1 connected in series between the supply voltage VCC and the current output line CP1, and the bias current source CB connected between the current output line CP1 and the ground potential of the circuit. The unit D/A converter UDA2 includes the switch S2 and the current source C2 connected in series between the current output line CP2 and the ground potential of the circuit.

The unit D/A converter UDA1 is fed with the 4-bit digital signals D4 to D7 including the most significant bit from the preceding circuit (not shown) of the portable communication terminal unit. The unit D/A converter UDA2 is fed with the 4-bit digital signals D0 to D3 including the least significant bit. As a result, the unit D/A converters UDA1 and UDA2 are coupled in series in the so-called "backward order".

In this embodiment, the current converter CV1 is an inverted output type current amplifier which has an amplification factor g1 determined by the minus 4 power of 2 of the bit number 4 of the digital signals D4 to D7 to be fed to the corresponding unit D/A converter UDA1:

$$g1=-16.$$

Moreover, the current converter CV2 is an inverted output type current amplifier which has a gain g2 determined by the following:

$$g2=-R3.$$

From these results, the analog current I1 at the output node of the unit D/A converter UDA1 becomes:

$$I1=C1-CB=(p-8)i,$$

and the analog current I2 at the output node of the current converter CV1 takes the following:

$$I2=g1\times I1=16(p-8)i.$$

On the other hand, the analog current I3 at the output node of the unit D/A converter UDA2 takes the following:

$$I3=-C2+I2=-(q+16p-128)i,$$

and the analog output voltage Vo at the output node of the current converter CV2, i.e., the D/A converter, is biased by the bias voltage VB and becomes a function of the binary values q and p of the digital signals D0 to D7 having the unit current i as the coefficient:

$$\begin{aligned} Vo &= VB + g2 \times I3 \\ &= VB + R3(q + 16p - 128)i \end{aligned}$$

The analog output voltage Vo to be outputted from the D/A converter of this embodiment takes the following maximum Vomax for q=p=15 and the following minimum Vomin for q=p=0:

$$Vomax=VB+R3\times 127i;$$

and $$Vomin=VB-R3\times 128i.$$

And, the analog output voltage Vo becomes Vocen for q=0 and p=8:

$$Vocen=VB.$$

As is apparent from the description made above, in the D/A converter of this embodiment, the analog current outputted from the unit D/A converter UDA1 is amplified by the current converter CV1 and added to the current output line CP2 of the unit D/A converter UDA2. The current value of the current source composing each unit D/A converter is set with reference to the unit D/A converter UDA2.

The D/A converter of this embodiment can set the unit current i to a low value to promote low power consumption but its S/N ratio may become degraded because the noises generated exterior to the unit D/A converter UDA1 are also amplified by the current converter CV1.

Figure 10:
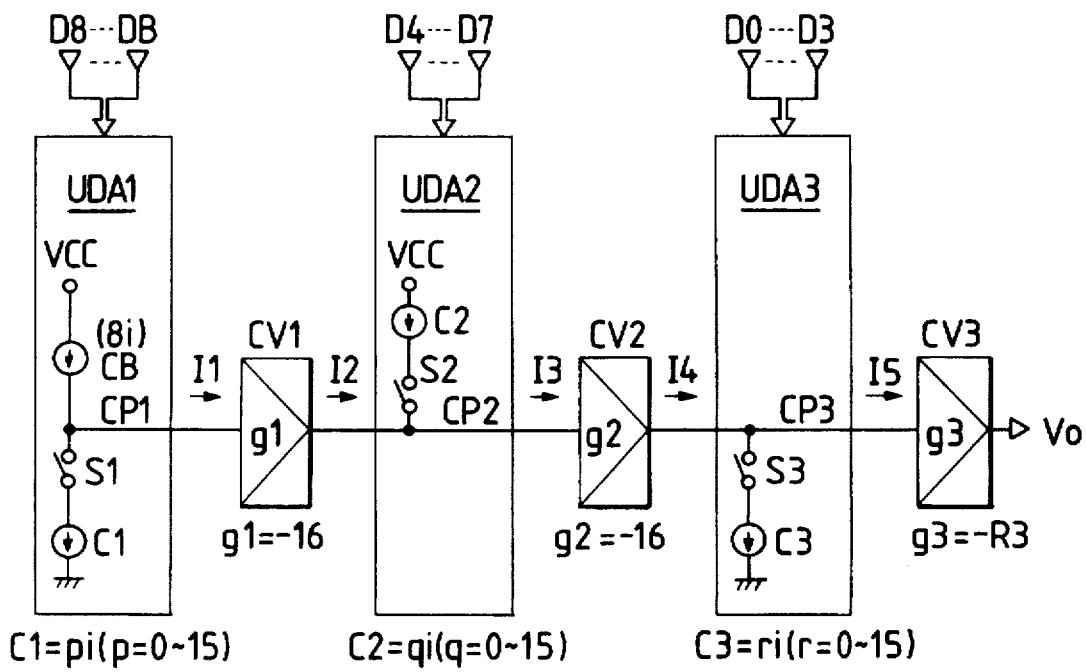
FIG. 10 is an equivalent circuit diagram showing a seventh embodiment of the D/A converter, to which is applied the present invention.

FIG. 10 is an equivalent circuit diagram showing a seventh embodiment of the D/A converter, to which is applied the present invention. Incidentally, since the D/A converter of this embodiment basically follows the foregoing embodiments of FIGS. 1 to 3 and FIG. 9, the description to be added is directed exclusively to the portions different therefrom.

In FIG. 10, the D/A converter of this embodiment is constructed to include three unit D/A converters UDA1 to UDA3 coupled in the backward order in series through the current converter CV1. The current converter CV3 receives the output of the unit D/A converter UDA3. Of these, the unit D/A converter UDA1 includes: the bias current source CB connected between the supply voltage VCC and the current output line CP1, the switch S1, and the current source C1 connected in series between the current output line CP1 and the ground potential of the circuit.

The unit D/A converter UDA2 includes the current source C2 and the switch S2 connected in series between the supply voltage VCC and the current output line CP2. The unit D/A converter UDA3 includes the switch S3 and the current source C3 connected in series between the current output line CP3 and the ground potential of the circuit. The unit D/A converter UDA1 is fed with the 4-bit digital signals D8 to DB including the most significant bit from the preceding circuit (not shown) of the portable communication terminal unit. The unit D/A converters UDA2 and UDA3 are respectively fed with the 4-bit digital signals D4 to D7 and the 4-bit digital signals D0 to D3.

In this embodiment, the current converters CV1 CV2 are inverted output type current amplifiers with respective amplification factors g1 and g2 determined by the fourth power of 2 of the bit number 4 of the digital signals to be fed to the corresponding unit D/A converters:

$$g1=g2=-16.$$

Moreover, the current converter CV3 is an inverted output type current-voltage converter with gain g3 determined by the following:

$$g3=-R3.$$

From these results, the analog current I1 at the output node of the unit D/A converter UDA1 takes the following:

$$I1=-C1+CB=(8-p)i,$$

and the analog current I2 at the output node of the current converter CV1 takes the following:

$$I2=g1\times I1=-16(8-p)i.$$

On the other hand, the analog current I3 at the output node of the unit D/A converter UDA2 takes the following:

$$I3=C2+I2=(q+16p-128)i,$$

and the analog current I4 at the output node of the current converter CV2 takes the following:

$$I4=g2\times I3=-16(q+16p-128)i.$$

Moreover, the analog current I5 at the output node of the D/A converter UDA3 takes the following:

$$I5=-C3+I4=-(r+16q+256p-2048)i,$$

and the analog output voltage Vo at the output node of the current converter CV3, i.e., the D/A converter, is biased by the bias voltage VB and becomes a function of the binary values r, q and p of the digital signals D0 to DB having the unit current i as the coefficient:

$$\begin{aligned} Vo &= VB + g3 \times I5 \\ &= VB + R3(r + 16q + 256p - 2048)i \end{aligned}$$

The analog output voltage Vo to be outputted from the D/A converter of this embodiment takes the following maximum Vomax for r=q=p=15 and the following minimum Vomin for r=q=p=0:

$$Vomax=VB+R3\times 2048i;$$

and $$Vomin=VB-R3\times 2048i$$

And, the analog output voltage Vo is Vocen for r=q=0 and p=8:

$$Vocen=VB.$$

Figure 11:
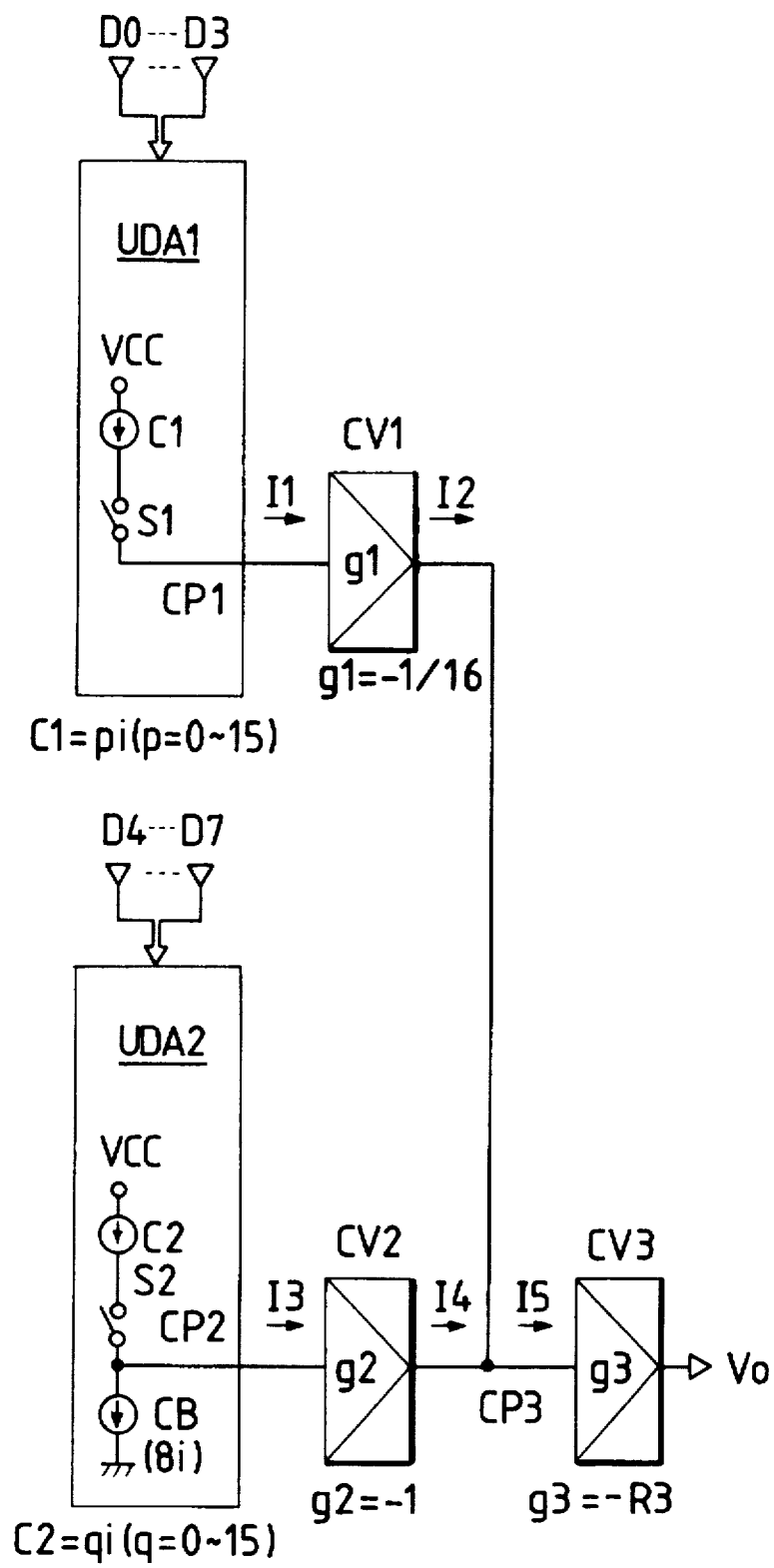
FIG. 11 is an equivalent circuit diagram showing an eighth embodiment of the D/A converter, to which is applied the present invention.

FIG. 11 is an equivalent circuit diagram showing an eighth embodiment of the D/A converter, to which is applied the present invention. Incidentally, since the D/A converter of this embodiment basically follows the foregoing embodiment of FIGS. 1 to 3, the description to be added is directed exclusively to the portions different therefrom.

In FIG. 11, the D/A converter of this embodiment is constructed to include two unit D/A converters UDA1 and UDA2 coupled in parallel through the current converters CV1 and CV2. The current converter CV3 has an input node coupled to the output node coupled commonly to the aforementioned current converters CV1 and CV2.

The unit D/A converter UDA1 includes the current source C1 and the switch S1 connected in series between the supply voltage VCC and the current output line CP1. The unit D/A converter UDA2 includes: the current source C2, the switch S2 connected in series between the supply voltage VCC and the current output line CP2, and the bias current source CB connected between the current output line CP1 and the ground potential of the circuit. The unit D/A converter UDA1 is fed with the 4-bit digital signals D0 to D3 including the least significant bit from the preceding circuit (not shown) of the portable communication terminal unit. The unit D/A converter UDA2 is fed with the 4-bit digital signals D4 to D7 including the most significant bit.

In this embodiment, the current converter CV1 is an inverted output type current amplifier with an amplification factor g1 determined by the 0-th power of 2 of the total bit number 0 of the digital signals to be fed to the preceding unit D/A converters:

$$g1 = -1/16.$$

The current converter CV2 is an inverted output type current amplifier with an amplification factor g2 determined by the minus fourth power of 2 of the total bit number 4 of the digital signals to be fed to the succeeding unit D/A converter UDA1 and so on:

$$g2 = -1.$$

The current converter CV2 is an inverted output type current-voltage converter which has a gain g3 determined by the following value:

$$g3 = -R3.$$

From these results, the analog current I1 at the output node of the unit D/A converter UDA1 takes the following:

$$I1 = C1 = pi,$$

and the analog current I2 at the output node of the current converter CV1 takes the following:

$$I2 = g1 \times I1 = -pi/16.$$

On the other hand, the analog current I3 at the output node of the unit D/A converter UDA2 takes the following:

$$I3 = C2 - CB = (q-8)i,$$

and the analog current I4 at the output node of the current converter CV2 takes the following:

$$I4 = g2 \times I3 = -16(q-8)i.$$

As a result, the current value I5 of the current converter CV3 takes the following:

$$\begin{aligned} I5 &= I3 + I4 \\ &= -(q + p/16i - 8)i \end{aligned}$$

and the analog output voltage Vo at the output node of the current converter CV3, i.e., the D/A converter, is biased by the bias voltage VB and becomes a function of the binary values q and p of the digital signals D0 to D7 having the unit current i as the coefficient:

$$\begin{aligned} Vo &= VB + g3 \times I5 \\ &= VB + R3(q + p/16 - 8)i \end{aligned}$$

The analog output voltage Vo to be outputted from the D/A converter of this embodiment takes the following maximum Vomax for q=p=15 and the following minimum Vomin for q=8 and p=0:

$$Vomax = VB + R3 \times (7 + {}^{15}\!/_{16})i$$

and $$Vomin = VB - R3 \times 8i.$$

And, the analog output voltage Vo is Vocen for q=8 and p=0:

$$Vocen = VB.$$

Figure 12:
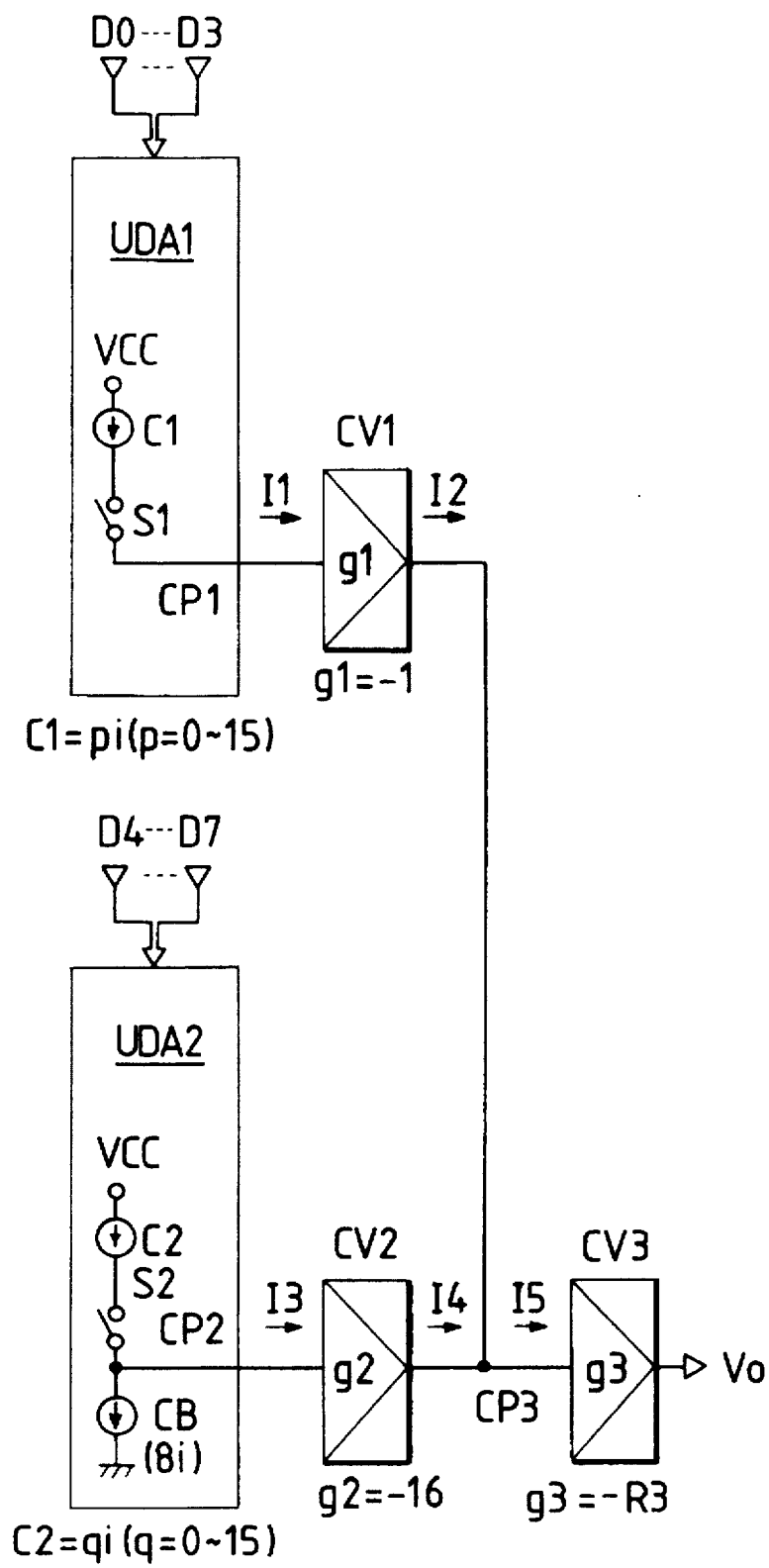
FIG. 12 is an equivalent circuit diagram showing a ninth embodiment of the D/A converter, to which is applied the present invention.

FIG. 12 is an equivalent circuit diagram showing a ninth embodiment of the D/A converter, to which is applied the present invention. Incidentally, since the D/A converter of this embodiment basically follows the foregoing embodiments of FIGS. 1 to 3 and FIG. 11, the description to be added is directed exclusively to the portions different therefrom.

In FIG. 12, the D/A converter of this embodiment is constructed to include two unit D/A converters UDA1 and UDA2 coupled in the forward order in series through the current converters CV1 and CV2. The current converter CV3 has an input node coupled to the output node coupled commonly to the aforementioned current converters CV1 and CV2.

The unit D/A converter UDA1 includes the current source C1 and the switch S1 connected in series between the supply voltage VCC and the current output line CP1. The unit D/A converter UDA2 includes: the current source C2, the switch S2 connected in series between the supply voltage VCC and the current output line CP2, and the bias current source CB connected between the current output line CP1 and the ground potential of the circuit. The unit D/A converter UDA1 is fed with the 4-bit digital signals D0 to D3 from the preceding circuit (not shown) of the portable communication terminal unit. The unit D/A converter UDA2 is fed with the 4-bit digital signals D4 to D7.

In this embodiment, the current converter CV1 is an inverted output type current amplifier with an amplification factor g1 determined by the 0-th power of 2 of the total bit number 4 of the digital signals to be fed to the preceding unit D/A converters:

$$g1 = -1.$$

The current converter CV2 is an inverted output type current attenuator with an attenuation factor g2 determined by the minus nm-th power of 2 (wherein the nm is the bit number 4 of the digital signals D8 to DB to be fed to the succeeding unit D/A converter UDA3):

$g2=-1/16$.

Moreover, the current converter CV3 is an inverted output type current-voltage converter which has a gain g3 determined by the following value:

$g3=-R3$.

From these results, the analog current I1 at the output node of the unit D/A converter UDA1 takes the following:

$I1=-C1=pi$, and the analog current I2 at the output node of the current converter CV1 takes the following:

$I2=g1 \times I1=pi$.

On the other hand, the analog current I3 at the output node of the unit D/A converter UDA2 takes the following:

$I3=C2-CB=(q-8)i$, and the analog current I4 at the output node of the current converter CV2 takes the following:

$I4=g2 \times I3=-16(q-8)i$.

Moreovers the analog current I5 at the output node of the D/A converter UDA3 takes the following:

$$I5 = -I3+I4 = -(16g+p-128)i$$

and the analog output voltage Vo at the output node of the current converter CV3, i.e., the D/A converter, is biased by the bias voltage VB and becomes a function of the binary values r, q and p of the digital signals D0 to D7 having the unit current i as the coefficient:

$$Vo = VB+g3 \times I5 = VB+R3(16g+p-128)i$$

The analog output voltage Vo to be outputted from the D/A converter of this embodiment takes the following maximum Vomax for r=q=p=15 and the following minimum Vomin for r=q=p=0:

$Vomax=VB+R3 \times 127i$;

and $Vomin=VB-R3 \times 128i$.

And, the analog output voltage Vo is Vocen for r=8 and q=p=0:

$Vocen=VB$.

Thus, in the aforementioned embodiments 8 and 9, the effects similar to those of the foregoing plurality of embodiments can be easily achieved by coupling the plurality of unit D/A converters in parallel with the current attenuator or amplifier having the predetermined attenuation or amplification factor. Although one current converter is added in these embodiments, as is apparent from the description thus far made, the current sources composing the individual unit D/A converters can be constructed in the same direction without inverting the corresponding digital signals so that their current values can be set easily and properly.

Figure 13:
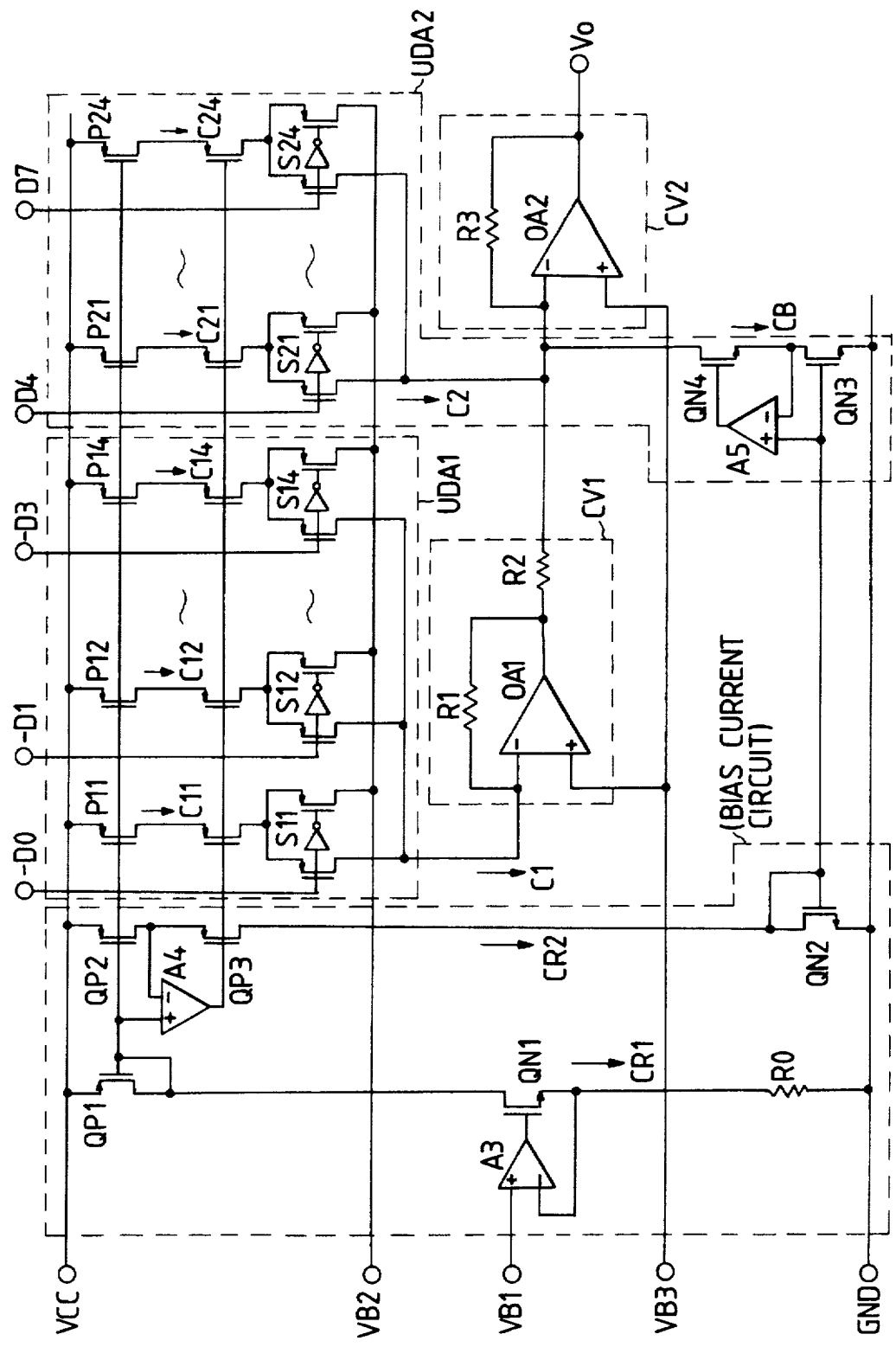
FIG. 13 is a specific circuit diagram showing one embodiment of the D/A converter according to the present invention.

FIG. 13 is a specific circuit diagram showing one embodiment of the D/A converter according to the present invention. This embodiment corresponds to FIG. 7. The current sources C1, C2 and CB included in the unit D/A converters UDA1 and UDA2, are realized by the mirror construction of a constant current CR2, which is formed in the bias current circuit.

The bias current circuit has its constant current CR1 generated by feeding a bias voltage VB1, which is fed to the non-inverted input terminal of an operational amplifier A3, to a resistance element RO. In other words, the output of the operational amplifier A3 is fed to the gate of an N-channel MOSFET QN1, which has its source fed back to the inverted input terminal and connected with the resistance element RO. As a result, the aforementioned bias voltage VB1 is fed to the resistance element RO to generate a constant current of $CR1=VB1/RO$.

The aforementioned constant current CR1 is fed to an input of a P-channel MOSFET QP1 in the current mirror circuit so that the aforementioned constant current CR2 is generated from an output of a P-channel MOSFET QP2. Here, so that the output constant current CR2 is not changed by the change in the drain voltage of the output of the P-channel MOSFET QP2, the output of a differential amplifier A4 is fed to the gate of a P-channel MOSFET QP3. The differential amplifier A4 receives drain voltages of QP1 and QP2. As a result, the drain voltage of MOSFET QP2 in the aforementioned current mirror circuit, can be equalized to the gate-drain voltage of MOSFET QP1 to produce the constant current CR2, retaining the mirror precision.

The unit D/A converter UDA1 corresponding to the less significant bit, has current sources C11 to C14 constructed of current mirror circuits like the aforementioned. Specifically, P-channel type MOSFETs P11 to P14 are commonly connected with the gate and drain MOSFET QP1. And, the drain voltages of the P-channel MOSFETs P11 to P14 also have their mirror precisions retained by the P-channel MOSFET which receives the output voltage of the aforementioned differential amplifier A4.

Each of the switches S11 to S14 is composed of a pair of P-channel MOSFETs. The P-channel MOSFETs at one side have their gates connected to input signals −D0 to −D3. These P-channel MOSFETs have their drains made common to generate the output analog current C1. The P-channel MOSFETs at the other side have their gates fed with inverted input signals −D0 to −D3. The P-channel MOSFETs to be switched by the output signals of those inverters have their drains connected with a bias voltage source VB2 to absorb the invalid current.

The unit D/A converter UDA1 corresponding to the more significant bit, has its current sources C21 to C24 constructed of current mirror circuits like the aforementioned. Specifically, P-channel type MOSFETs P21 to P24 are commonly connected with the gate and drain of the aforementioned input side P-channel MOSFET QP1. And, the drain voltages of the P-channel MOSFETs P21 to P24 acting as those current sources C21 to C24 also have their mirror precisions retained by the P-channel MOSFET which receives the output voltage of the aforementioned differential amplifier A4.

Each of the switches S21 to S24 is composed of a pair of P-channel MOSFETs. The P-channel MOSFETs at one side have their gates connected to input signals D4 to D7. These P-channel MOSFETs have their drains made common to generate the output analog current C2. The P-channel MOSFETs at the other side have their gates connected to inverted input signals D4 to D7. The P-channel MOSFETs to be switched by the output signals of those inverters, have their drains connected with a bias voltage source VB2 to absorb the invalid current.

The output current C1 of the unit D/A converter UDA1 is attenuated by $-\frac{1}{16}$ by the current converter CV1 and is synthesized with the output current C2 of the unit D/A converter UDA2.

The current source CB disposed in the unit D/A converter UDA2 is composed of N-channel MOSFETs QN2 and QN3 constructing the current mirror circuit which receives the aforementioned constant current CR2. The current source CB is further equipped with an N-channel MOSFET QN4 which has its gate connected to the output voltage of a differential amplifier A5 which receives the gate-drain voltage of the aforementioned input side MOSFET QN2 and the drain voltage of the output side MOSFET QN3. The MOSFET QN4 is connected in series with the output side MOSFET QN3 to equalize the drain voltage of the MOSFET QN3 to the gate-drain voltage of the input side MOSFET QN2 thereby to retain the mirror precision as in the current mirror circuit by the aforementioned P-channel MOSFETs.

The invalid currents to flow through the aforementioned switches S11 to S14 and S21 to S24 are absorbed by the aforementioned bias voltage source VB2 which is set substantially equal to the bias voltage VB3 fed to the non-inverted inputs of the aforementioned current converters CV1 and CV2.

The individual current sources C11 to C14 and C21 to C24 of the aforementioned unit D/A converters UDA1 and UDA2 are realized by the current mirrors which are proportional to either the gate electrode width ratio of the P-channel MOSFETs or the number of the parallel connection of the MOSFETs of the same gate electrode width. As described above, the current sources C11 to C14 and C21 to C24 are respectively set to identical values although the digital signals inputted to the unit D/A converters UDA1 and UDA2 have different weights. In order to restore the weights of the corresponding digital signals, the analog current C1 generated by the unit D/A converter UDA1 is attenuated by $-\frac{1}{16}$ by the current converter CV1.

As a result, the precision of the D/A converter depends upon the process dispersion of the resistor elements R0 to R3 including the resistance element for producing the aforementioned constant current and the resistance element R3 for producing the output voltage. Hence, these resistance elements R0 to R3 are made of the same resistance material. Thus, where the resistor R0 has its resistance increased by manufacturing fluctuation, the resistances of elements R1 to R3 are also increased at substantially equal fluctuation ratios. As a result, the constant currents CR1 and CR2 become lower than the intrinsically desired value. Thus, the unit D/A converters UDA1 and UDA2 have their respective currents C1 and C2 proportionally reduced, and the attenuation factor g1 (=−R1/R2) of the current converter CV1 is held constant whereas the gain g2 (=−R3) of the current-voltage converter CV2 increases. As a result, the voltage amplitude Vo at the output node of the current-voltage converter CV2, the analog output signal of the D/A converter, is stable with the intrinsically desired value.

In order to improve the precision of the absolute value, the resistor R0 may be made of an external part. For this, the MOSFET QN1 has its source terminal connected externally. The external resistance element can be connected to generate the desired current value CR1. Accordingly, the resistance element R3 of the current-voltage converter CV2 may also be made of an external resistance element.

Figure 14:
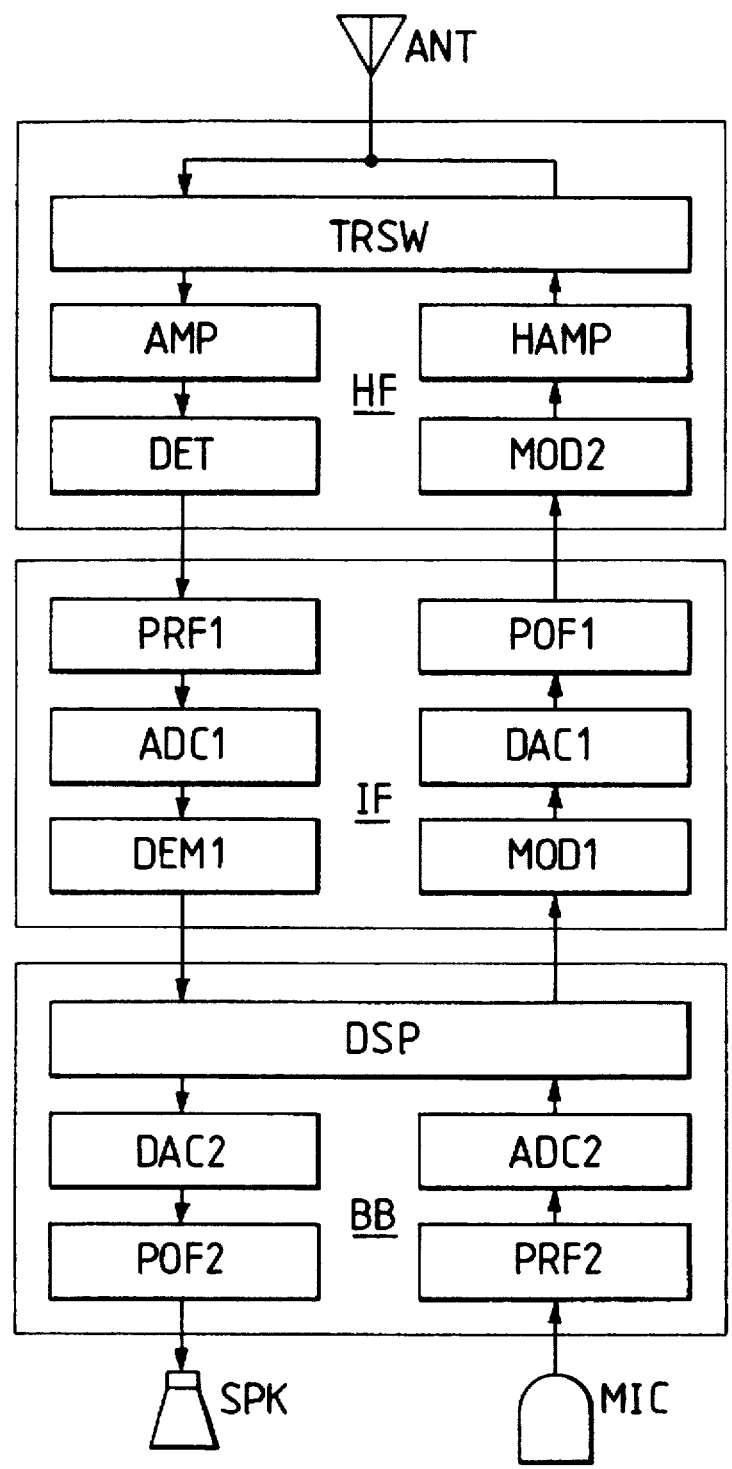
FIG. 14 is a block diagram showing one embodiment of a portable communication terminal unit, in which is packaged the D/A converter according to the present invention.

FIG. 14 is a block diagram showing one embodiment of a portable communication terminal unit, in which is packaged the D/A converter according to the present invention. With reference to FIG. 14, the portable communication terminal unit having the D/A converter packaged therein will be described. Incidentally, the circuit elements composing the individual blocks of FIG. 14 except the antenna ANT, the speaker SPK and the microphone MIC, are formed on a single semiconductor substrate of monocrystalline silicon or the like by the well-known technique for manufacturing a CMOS (i.e., complementary MOS) integrated circuit.

In FIG. 14, the portable communication terminal unit of this embodiment is equipped, although not especially limitative, with a base band unit BB, an intermediate band unit IF, a high frequency unit HF, where the speaker SPK and the microphone MIC are coupled to the base band unit BB, and the antenna ANT is coupled to the high frequency unit HF.

The base band unit BB includes a pre-filter PRF2, an A/D converter ADC2, a digital signal processor DSP, a D/A converter DAC2 and a post-filter POF2. In this embodiment, the D/A converter DAC2 is constructed in accordance with the foregoing plurality of embodiments.

The pre-filter PRF2 in the base band unit BB suppresses the high frequency noise component of the transmission analog speed signals inputted from the microphone MIC and transmits the suppressed speech signals to the A/D converter ADC2. This A/D converter ADC2 converts the analog speech signals transmitted from the pre-filter PRF2 into digital signals and transmits the digital signals to the digital signal processor DSP. This digital signal processor DSP subjects the digital speech signals transmitted from the A/D converter ADC2 to a band compression and transmits the processed digital speech signals to a modulator MOD1 of the intermediate frequency unit IF. At the same time, the digital signal processor DSP further subjects the received digital speech signals transmitted from the demodulator DEM1 of the intermediate frequency unit IF to a band extension and transmits the processed digital signals to the D/A converter DAC2. This D/A converter DAC2 converts the received digital speech signals transmitted from the digital signal processor DSP into analog signals. These received analog speech signals are amplified and outputted to the speaker SPK after their high frequency components have been suppressed by the post-filter POF2.

Next, the intermediate frequency unit IF is equipped with a modulator MOD1, a D/A converter DAC1, a post-filter POF1, a pre-filter PRF1, an A/D converter ADC1 and a demodulator DEM1. In this embodiment, the aforementioned D/A converter DAC1 is constructed in accordance with the foregoing plurality of embodiments.

The modulator MOD1 of the intermediate frequency unit IF subjects the transmission digital speech signals outputted from the digital signal processor DSP of the base band unit BB, to a modulation suited for radio transmission such as the GMSK (Gaussian Minimum Shift Keying) modulation or the QPSK modulation of /4 shift, and transmits the modulated digital speech signals to the D/A converter DAC1. This D/A converter DAC1 converts the transmitted digital modulation signals coming from the modulator MOD1 into analog signals. These analog modulation signals are transmitted to a modulator MOD2 of the high frequency unit HF after their high frequency components have been suppressed by the post filter POF1.

The pre-filter PRF1 transmits the received analog modulation signals transmitted from a detector DET of the high frequency unit HF, while suppressing their high frequency noise components, to the A/D converter ADC1. This A/D converter ADC1 converts the received analog modulation signals transmitted through the pre-filter PRF1 into digital signals. These received digital modulation signals are transmitted as the received digital speech signals to the digital signal processor DSP of the aforementioned base band unit BB after their basic signal components have been demodulated by the demodulator DEM1. Incidentally, the demodulator MOD1, the D/A converter DAC1 and the post-filter POF1 are composed of a plurality of modulators, D/A converters and post-filters connected in parallel, according to the system construction of the communication system so as to output a plurality of signals having their phases inverted or a plurality of signals having orthogonal phase differences of 90 degrees.

The high frequency unit HF is equipped with the modulator MOD2, a high power amplifier HAMP, a transmission/reception switch TRSW, an amplifier AMP and detector DET. Of these, the modulator MOD2 subjects the transmission analog modulation signals transmitted from the post filter POF1 of the intermediate frequency unit IF to a modulation by a radio frequency carrier signal of about 800 MHZ to 2 GHz, for example. These transmission signals are outputted to the antenna ANT through the transmission/reception switch TRSW after they have been amplified to a predetermined transmission power by the high power amplifier HAMP.

The amplifier AMP amplifies the received signals inputted from the antenna ANT through the transmission/reception switch TRSW and transmits them to the detector DET. This detector DET extracts desired reception analog modulation signals from the received signals and transmits the extracted analog modulation signals to the pre-filter PRF1 of the intermediate frequency unit IF.

As described above, the portable communication terminal unit of this embodiment includes the D/A converters according to the aforementioned plurality of embodiments. Size and power consumption are reduced by the aforementioned effects of the D/A converters. The portable communication terminal unit can adopt a battery drive suited for transportation thanks to the low power consumption and the low voltage of the operational power source.

The D/A converter DAC is constructed to include the current attenuator or amplifier for attenuating or amplifying the analog currents to be outputted from the individual unit D/A converters, and the current/voltage converter for converting the analog currents into voltage signals. Moreover, each current attenuator, current amplifier and current/voltage converter is constructed with operational amplifiers. Still moreover, the portable communication terminal unit of this embodiment includes the post-filters POF1 and POF2 respectively at the succeeding stages of the D/A converters DAC1 and DAC2, and adopts the method by which the high frequency components contained in the output voltage waveforms by those low frequency post-filters, are suppressed to a desired level as to exert no influence upon the performances of the portable communication terminal unit. As a result, this portable communication terminal unit has its communication characteristics improved to promote its high performance.

Figure 16:
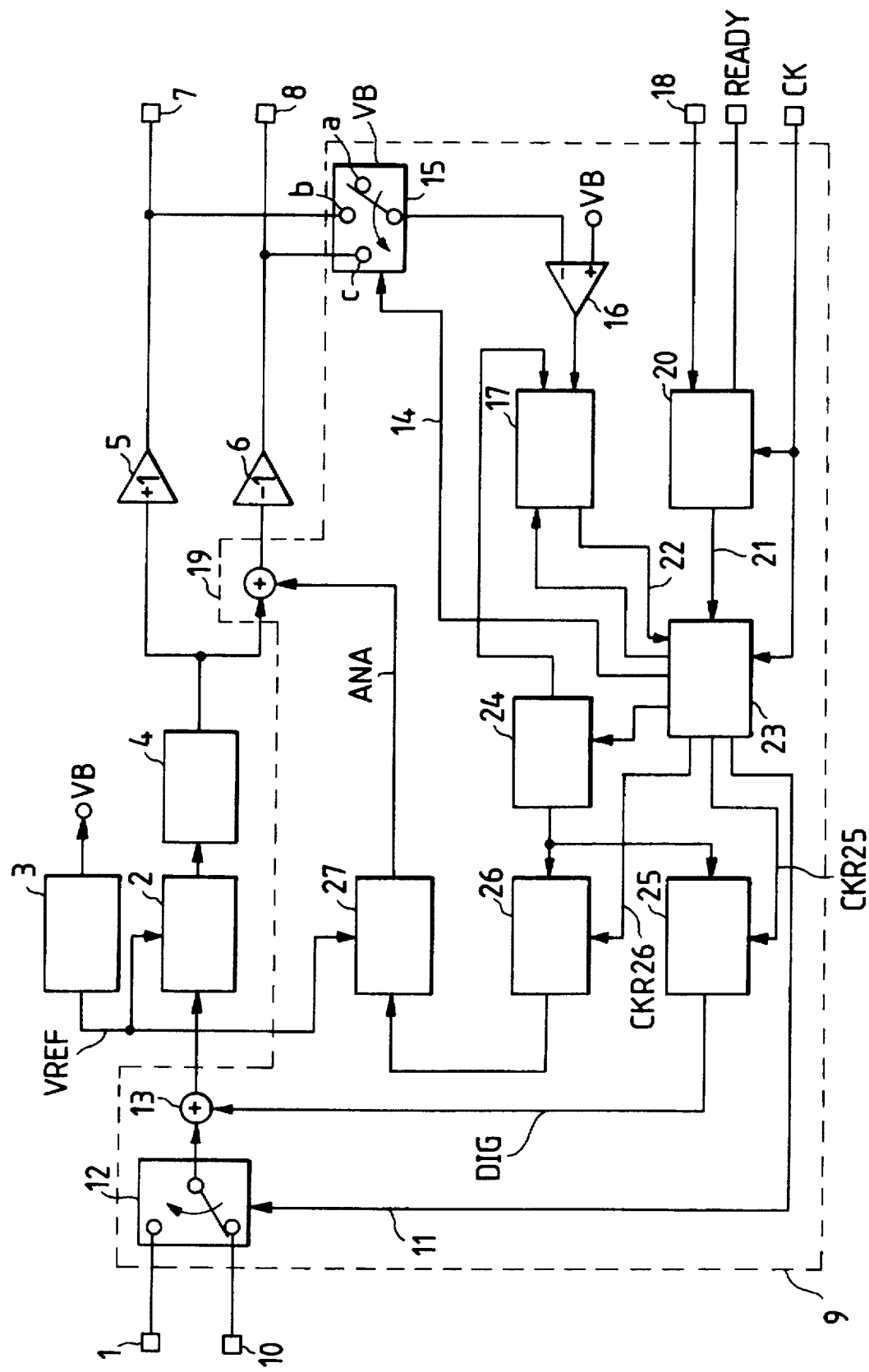
FIG. 16 is a block diagram showing a first embodiment of an offset adjustor according to the present invention.

FIG. 16 is a block diagram showing a first embodiment of an offset adjustor according to the present invention. The circuit to be adjusted by an offset adjustor 9 of this embodiment includes: a main D/A converter 2 for converting an input digital signal 1 into an analog signal corresponding to the value of the digital signal 1; a low pass filter 4 for suppressing the high frequency component contained in the output signal of the aforementioned main D/A converter 2; a non-inverting buffer amplifier 5 and an inverting buffer amplifier 6 for receiving the output of that low pass filter 4 in parallel; and output terminals 7 and 8 for the analog signals which are outputted from the non-inverting buffer amplifier 5 and inverting amplifier 6 and have their phases made different by 180 degrees in positive and opposite phases.

A reference voltage generator, designated at 3 in FIG. 16, generates a first reference voltage VREF for determining the output amplitude of the aforementioned main D/A converter 2 and a second reference voltage VB for determining the central value of the analog output signal and feeds the two reference voltages to corresponding circuits. The main D/A converter 2 can be exemplified by those described with reference to FIGS. 1 to 13.

Where the offset adjustor 9 is not used in the above construction, the output offset values at the terminals 7 and 8 may be considerable in the worst case, when added, even if the second reference voltage VB fed from the reference voltage generator 3, is precise, because the circuits 2 to 6 composed generally of active elements individually, have higher or lower offset voltages due to the manufacture fluctuations of the semiconductor integrated circuit.

If, for example, the opposite phase analog output of the terminal 8 is subtracted from the positive phase analog output of the terminal 7 to cancel the noise components in phase and to double the signal amplitude to improve the S/N ratio, a considerable noise component is left or newly produced in the subtracted analog signal unless the offsets of the two analog output signals are canceled to a negligible extent.

The offset adjustor 9 performs its offset adjustment using an offset detecting reference signal 10 in place of the input digital signal 1. This offset detecting reference signal 10 is exemplified by a digital code decoder corresponding to the second reference voltage VB. The offset adjustor 9 is equipped with an adder 13 and an adder 19 for adding the adjusted negative feedback signals DIG and ANA for the offset adjustment.

The digital negative feedback signal DIG is fed back to the input unit of the aforementioned main D/A converter 2 by the adder 13 to adjust the offset of the positive phase analog signal (i.e., the output signal of the terminal 7), and the other analog negative feedback signal ANA is fed back by the adder 19 to the signal path, which is branched from the output of the aforementioned D/A converter 2, to adjust the offset of the opposite phase analog output signal (i.e., the output signal of the terminal 8).

The aforementioned digital negative feedback signal DIG is outputted from a first register 25. The aforementioned analog negative feedback signal ANA is produced by converting the digital value, latched by a second register 26, into the analog signal by an auxiliary D/A converter 27. The register 25 fetches the output of a counter 24 in synchronism with the clock change of a clutch signal CKR25. Likewise, the register 26 fetches the output of the counter 24 in synchronism with the clock change of the clutch signal CKR26.

In order to produce the aforementioned offset detecting reference signal 10, there is provided a switch circuit 12 for switching the aforementioned input digital signal 1 and the offset detecting reference signal 10 in response to a control signal 11 coming from a later-described pulse circuit 23. Further provided are a switch circuit 15, a voltage comparator 16, a logic circuit, a timer 20 and the pulse circuit 23 for producing data for the offset adjustment using the aforementioned counter 24.

In response to a control signal 14 coming from the later-described pulse circuit 23, the aforementioned switch circuit 15 switches among the analog outputs from the aforementioned buffer amplifiers 5 and 6 and the second reference voltage VB from the aforementioned reference voltage feed circuit 3. The switch circuit 15 outputs the voltage VB in the initial state from a terminal a, then selects the output of the buffer amplifier 5 from a terminal b in synchronism with the timing for the offset adjustment with the digital negative feedback signal DIG, and finally selects the output of the buffer amplifier 6 from a terminal c in synchronism with the timing for the offset adjustment with the analog negative feedback signal ANA. The order of this selection is controlled by the signal 14. The voltage comparator 16 compares the magnitudes of the output of the switch circuit 15 and the desired DC voltage value (i.e.; the second reference voltage VB in this embodiment) of the aforementioned analog output.

The aforementioned logic circuit 17 receives the output of the voltage comparator 16, the overflow carry of the counter 24 and the pulses of the later-described pulse circuit 23, to detect the polarity change of the output of the voltage comparator 16. Specifically, the initial output polarity of the buffer amplifier 5, detected by the voltage comparator 16 when the offset detecting reference signal 10 was selected but the negative feedback is not yet effected in response to the digital negative feedback signal DIG, has its change detected when it is inverted by the negative feedback of the digital negative feedback signal DIG. Incidentally, the amount of the negative feedback at such polarity changing timing is used as the control for the offset adjustment, as will be described hereinafter.

The aforementioned timer 20 is set for counting the number of clocks CK with reference to a signal such as the reset signal, which is fed in response to the operation of a switch (not shown) for changing the supply voltage for an electronic circuit, including the offset adjuster 9, from OFF to ON states, thereby outputting a predetermined logic level signal 21 after a predetermined time period based on the circuit design until the output voltages VREF and VB of the aforementioned reference voltage feed circuit 3 are stabilized.

In response to the output 21 of the timer 20, the output 22 of the decider 17 and the clock CK, the pulse generator 23 generates and feeds frequency-divided pulses to the individual units. This pulse generator 23 starts when the output 21 of the timer 20 is activated, its operations to generate and feed a variety of pulses including: a pulse to select the terminal b of the switch circuit 15 at first in response to the signal 14; a pulse to activate the clock CKR25 so that the counted value of the counter 24 may be fetched by the register 25; a pulse to select the terminal c of the switch circuit 15 in response to the signal 14; and a pulse to activate the clock CKR26 so that the counted value of the counter 24 may be fetched by the register 26.

After the register 25 or 26 fetches the counted value of the counter 24 to start the negative feedback control of the amount of offset, the polarity inversion of the output of the aforementioned voltage comparator 16 is transmitted, if detected by the logic circuit 17, via signal 22 to the pulse generator 23. Then, the pulse generator 23 interrupts the clock change of the clock signal CKR25 or CKR26 to cause the counted value at this time to be latched by the corresponding register 25 or 26 as control data.

Figure 17:
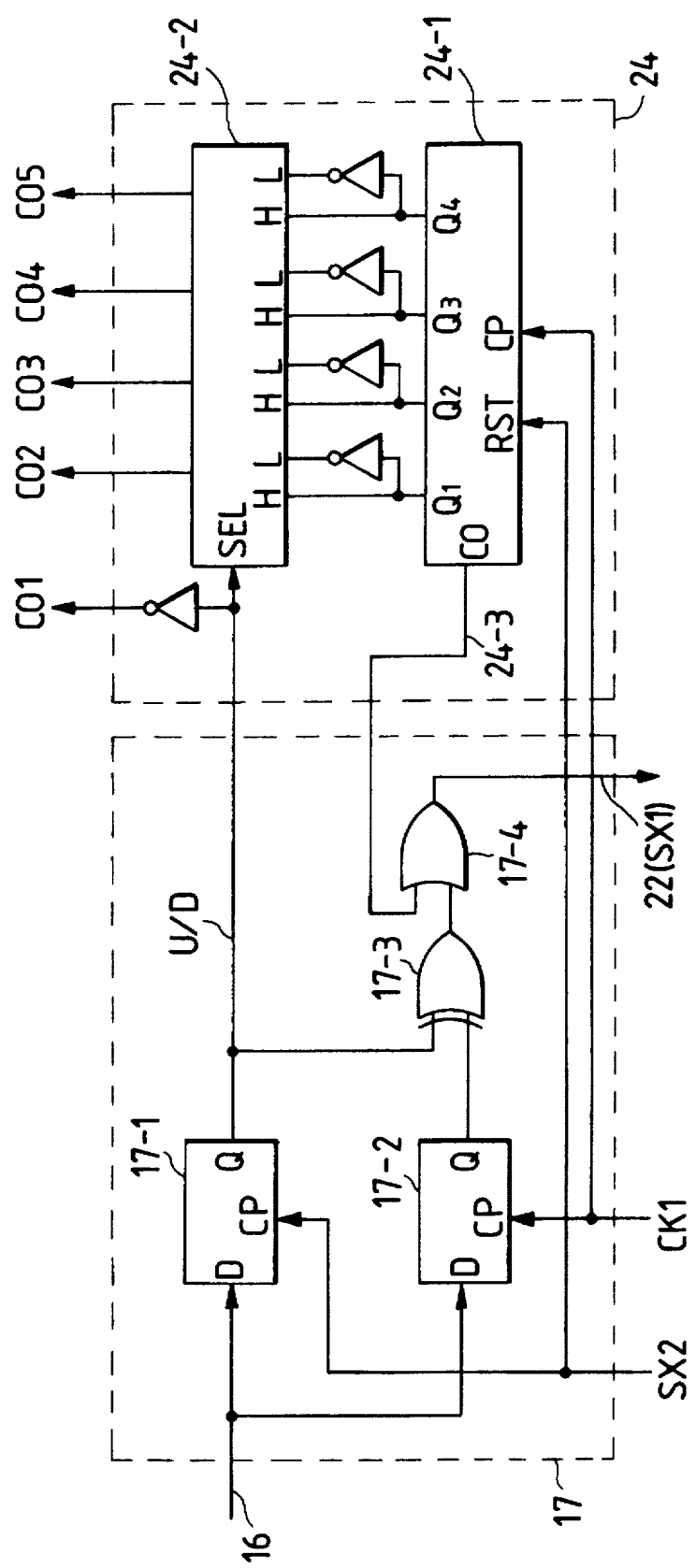
FIG. 17 is a logic circuit diagram showing one example of a counter and a detector.

FIG. 17 shows one example of the aforementioned decider 17 and counter 24. The decider 17 is composed of flip-flop circuits 17-1 and 17-2, an exclusive OR circuit 17-3 and an OR circuit 17-4. The counter 24 is a bidirectional 4-bit counter composed of a binary synchronous counter 24-1 and a selector 24-2. The flip-flop 17-1 latches the output of the voltage comparator 16 in synchronism with the reset operation of the binary synchronous counter 24-1 in response to a signal SX2. The output U/D of the flip-flop indicates 17-1 indicates the polarity of the offset adjusted feedback signal and is used for controlling the counting direction of the counter 24.

If the signal U/D is at 1 (i.e., the high logic level or the high level), the outputs C02 to C05 of the counter 24 count in the UP direction from 0000 (+0) to 1111 (+15) after reset. If the signal U/D is at 0 (i.e., the low logic level or the low level), on the contrary, the outputs of the counter 24 count in the DOWN direction from 1111 (-1) to 0000 (-16). These counting operations are synchronized with a clock CK1. The flip-flop circuit 17-2 fetches the output of the voltage comparator 16 in synchronism with said clock CK1.

The output of the voltage comparator 16, which is fetched by the flip-flop circuit 17-2 at each counting time of the counter 24, is compared with the polarity of the signal U/D by the exclusive OR circuit 17-3. If the polarity of the voltage comparator 16 is inverted with respect to the polarity of the signal U/D, signal 22 (or SX1) is changed from the low to high level. Incidentally, this change can also be achieved by the overflow carry of the binary synchronous counter 24-1. This is because it is intended to end the control by deeming the overflow of the binary synchronous counter 24-1 as a trouble of the circuit.

Figure 18:
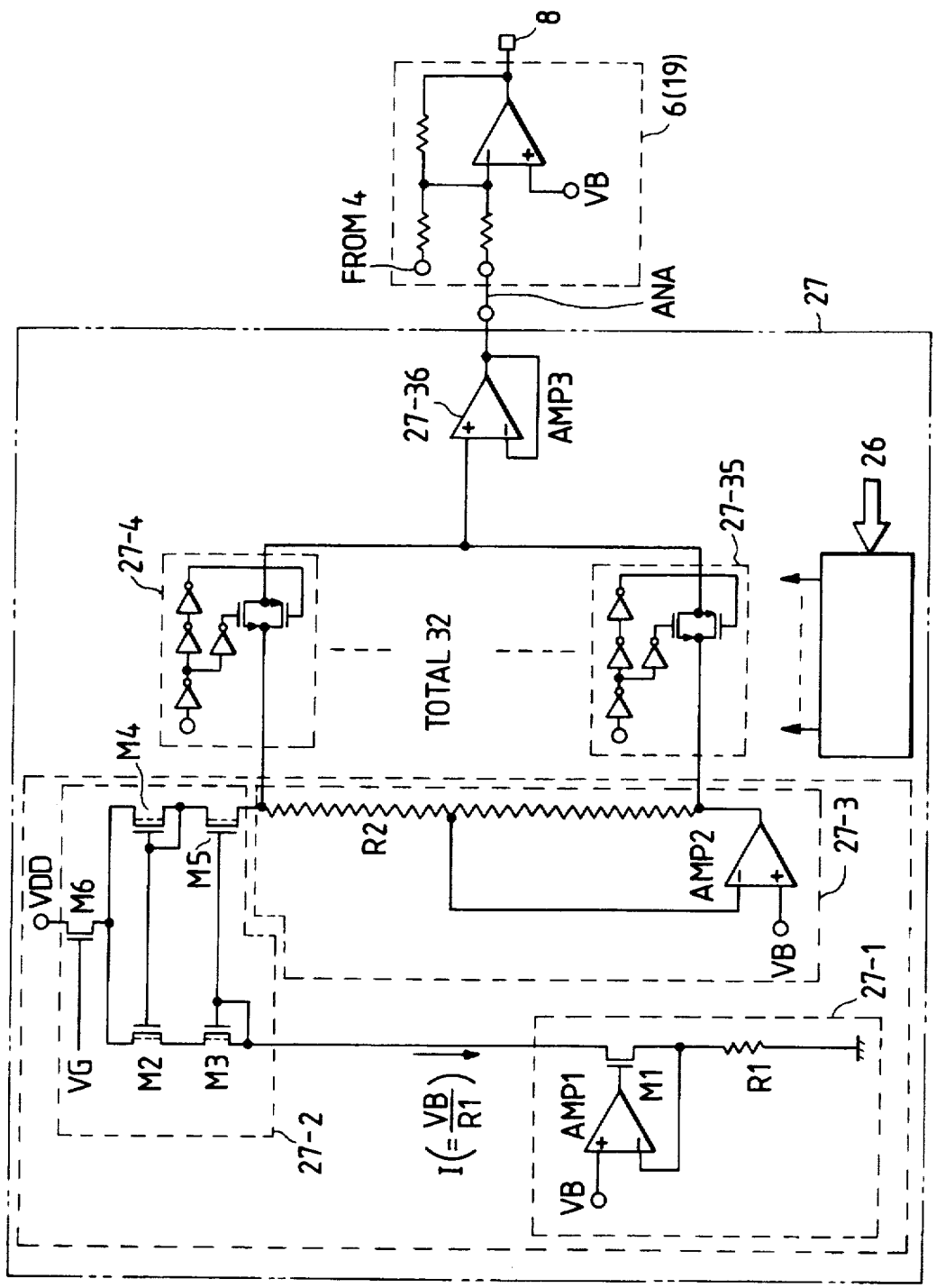
FIG. 18 is a circuit diagram showing one example of an auxiliary D/A converter and an inverted buffer acting as an analog addition logic.

FIG. 18 is a circuit diagram showing one example of the auxiliary D/A converter 27. This auxiliary D/A converter 27 is composed of step voltage generators 27-1 to 27-3, analog switch circuits 27-4 to 27-35, and an output buffer 27-36. The step voltage generator is composed of the voltage/current converter 27-1, the current mirror circuit 27-2 and the resistor row circuit 27-3.

The voltage/current converter 27-1 converts the reference voltage applied to the non-inverted input terminal (+) of an operation amplifier AMPi, e.g., the output VB of the aforementioned reference voltage generator 3, into the DC current (=VB/R1), and drives the current mirror circuit 27-2 using the converted DC current as the drain current of a transistor Mi.

The current mirror circuit 27-2 is constructed, in one embodiment by adding a power down transistor M6, for reducing the electronic circuit by controlling a gate voltage VG, to the well-known Wilson circuit composed of transistors M2 to M5.

The resistor row circuit 27-3 is composed of a series of 2n resistors (having a unit resistance r) R2 (=2nr) which have their uppermost end connected with the current output terminal of the current mirror circuit 27-2, their lowermost end connected with the output of an amplifier AMP2, which has its non-inverted input terminal (+) connected with the aforementioned reference voltage VB, and their intermediate end connected with the inverted input terminal (-) of said amplifier AMP2, so that the divided voltages may be extracted from every two resistors including the uppermost and lowermost ends.

Now, in the case of the 5-bit construction including the aforementioned counter 24 and register 26 of FIGS. 16 and 17, it is sufficient to set n=31 so that the divided voltages to be extracted through the thirty two analog switches 27-4 to 27-35 and a buffer amplifier AMP3 (27-36) are VB}m, VB}S, VB}5 , - - - , and VB} 31. Here, the step voltage of 2 may be one half or less the minimum step voltage of the aforementioned main D/A converter 2 and may be determined from the resistance r and the output current of the current mirror circuit 27-2.

Incidentally, the adder 19 for adding the offset adjusting analog negative feedback signal ANA to the inverted buffer 6, as shown in FIG. 16, can be implemented with the signal inversion by a single operational amplifier using a resistance input/feedback virtual grounded type circuit construction, as shown in FIG. 18.

Figure 19:
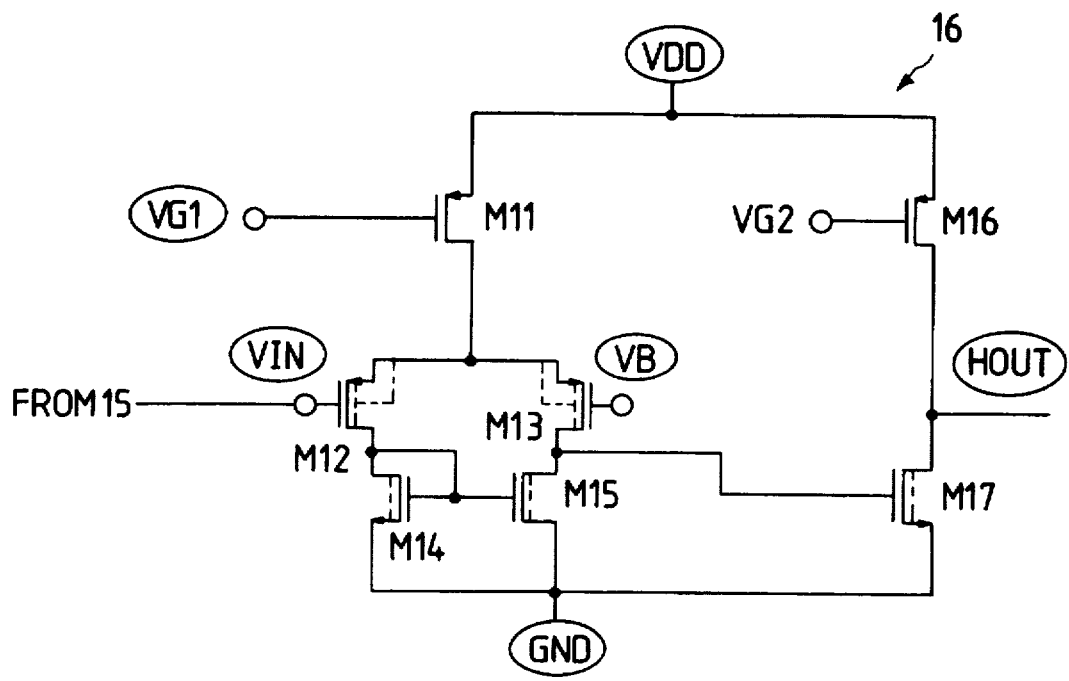
FIG. 19 is a circuit diagram showing one example of a voltage comparator.

FIG. 19 shows a detailed example of the voltage comparator 16. The individual circuit elements of FIG. 19 are formed over a semiconductor substrate of monocrystalline silicon using the well-known technique for manufacturing a CMOS (i.e., Complementary MOS) integrated circuit.

The voltage comparator 16 includes first and second P-channel MOS transistors M12 and M13, the former of which has its gate connected to a voltage VIN outputted from the aforementioned switch circuit 15 and M13 has its gate connected to the reference voltage VB. Between the common source of the MOS transistors M12 and M13 and a supply voltage VDD, there is connected a third P-channel MOS transistor M11 (i.e., the first constant current MOS transistor) which has its gate connected to a bias voltage VG1. Between the drains of the MOS transistors M12 and M13 and a ground potential GND, there are connected a first N-channel type MOS transistor M14, which has its gate and drain coupled to the drain of the MOS transistor M12, and a second N-channel MOS transistor M15 which has its drain coupled to the drain of the MOS transistor M13, thus constituting a differential stage.

An output stage is constructed of: a third N-channel MOS transistor M17 which has its gate coupled to the drain of the MOS transistor M13 and a fourth P-channel MOS transistor 1116 (i.e., the second constant current MOS transistor) which has its drain connected to the drain of the MOS transistor M17, its gate biased to the bias voltage VG2 and its source coupled to the supply voltage VDD.

In a comparator utilizing an operational amplifier or a differential amplifier, the potential of the output stage of the voltage comparator fluctuates highly from the supply voltage VDD to the ground potential GND even with a slight change in the inputs to be compared. At this time, the voltage comparator 16 is enabled to reduce the influence of its bias voltage fluctuation upon the differential step by making the bias voltage VG1 of the differential step and the bias voltage VG2 of the output step different from each other. Thus, a constant current can always be fed to the differential step so that an accurate decision can be performed.

The overall operations of the offset adjustor of this embodiment with reference to the timing chart of FIG. 20 will be described.

For example, when the feed of the supply voltage VDD to the electronic circuit including the offset adjustor 9, is switched from OFF to ON by the switch means, the signal 18, a reset signal, is simultaneously fed to initialize the stored data of the electronic circuit partially or wholly. The timer 20 counts the number of the clocks CK from the instant the reset signal PRST (or 18) is fed, and outputs a predetermined logic level signal VRON (or 21) after a predetermined time when the output voltage of the aforementioned reference voltage feed circuit 3 is stabilized.

In response to the logic level signal VRON (or 21); the pulse circuit 23 sequentially generates a single-shot pulse SXO for one period of the clock CK, the control signal 11 for feeding the offset detecting reference digital signal 10 to the main D/A converter 2, and the control signals 14 (i.e., 14-a, 14-b and 14-c) for changing the analog signal to be fed to the voltage comparator 16 from the reference voltage VB to the output 7 of the non-inverted buffer 5, although not especially limited thereto. The signal SXO is positioned as a pulse signal for triggering the later-described pulse signal SX2.

In the description made above, the offset detecting reference digital signal may be exemplified by an all-zero (or a low logic level) signal which corresponds to the number of converted bits inputted to the main D/A converter 2, as indicated by a complement of 2. In the aforementioned state, moreover, both the registers 25 and 6, constructed to correspond to a plurality of less significant bits of the converted bit number constituting the main D/A converter 2, have the all-zero output so that the difference between the output voltage (V7) of the non-inverted buffer 5 at this time and the reference voltage VB is the offset voltage.

Figure 20:
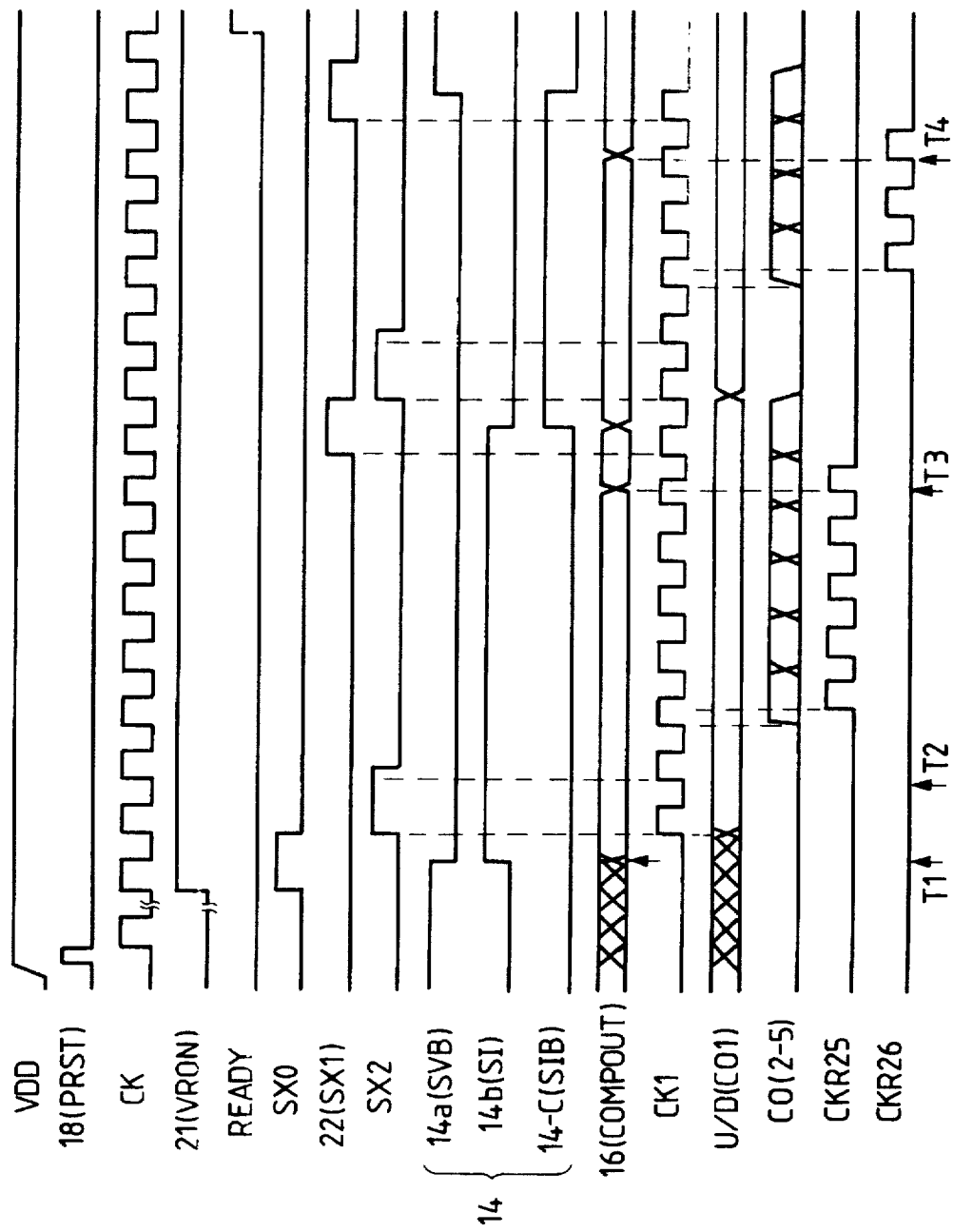
FIG. 20 is a timing a chart for explaining the operations of an offset adjustor according to the first embodiment of FIG. 16.

As a result, the output of the voltage comparator at time T1 of FIG. 20 takes the value 1, i.e., the high logic level (or the value 0, i.e., the low logic level) for V7 VB (or V7 VB). The voltage comparator 16 has its output (i.e., COMPOUT) latched by the flip-flop 17-1 in response to the pulse SX2, which is delayed by 1 clock from the single-shot pulse SXO, and simultaneously latched by the flip-flop 17-2 in response to the clock CK1, as shown in FIGS. 17 and 20.

The output U/D of the flip-flop 17-1 indicates the polarity of the offset adjusted feedback signal and is used for controlling the counting direction of the bidirectional counter 24. The outputs C02 to C05 of the counter 24 are counted, if composed of 4 bits, in the UP direction from time T2 of FIG. 20 from 0000 (+0) to 1111 (+15), if the signal U/D is at 1 (i.e., the high logic level), and in the DOWN direction from 1111 (−1) to 0000 (−16) if the signal U/D is at 0 (i.e., the low logic level).

The outputs CO1 to COB of the counter sequentially latched by the register 25 in response to the clock CKR25 fed from the aforementioned pulse circuit 23. The output of the register 25 is applied to the adder 13 as the offset adjusted negative feedback signal DIG which is increased or decreased at a constant step interval relative to the output 7 of the non-inverted buffer amplifier 5. As a result, as indicated at time T3, the output of the voltage comparator 16 is inverted to output 1 (i.e., the high logic level) from the exclusive OR gate 17-3, or the carry signal 24-3 to be outputted when the aforementioned counter 24-1 is at 1111 takes the value 1 (i.e., the high logic level). Then, the decision end signal SX1 (or 22) is outputted from the OR gate 17-4, and the offset detection and adjustment of the output 7 of the non-inverted buffer amplifier 5 are ended.

On the basis of the decision end signal Sx1 (or 22), there are generated from the pulse circuit 23 the control signals 14 (e.g., 14-a, 14-b and 14-c) for switch 15 to feed the output 8 of the inverted buffer 6 to the voltage comparator 16. Simultaneously with this, there is outputted the pulse SX2 for latching the flip-flop 17-1 of the decider 17-1 and for resetting the counter 24-1 so that the counting operation of the bidirectional counter 24 is started in accordance with the polarity of the voltage comparator 16 latched in the flip-flop 17-1.

In this case, the outputs of the bidirectional counter 24 are sequentially latched in the second register 26 in response to the clock CKR26, and the signal, which is converted from the output of the register 26 into an analog voltage by the auxiliary D/A converter 27, is used as the offset adjusted negative feedback signal ANA which is increased or decreased at a constant step interval relative to the output 8 of the inverted buffer 6. As a result, as indicated at time T4 in FIG. 20, the output of the voltage comparator 16 is inverted to output the value 1 (i.e., the high logic level) from the exclusive OR gate 17-3, or the carry signal is outputted by the aforementioned counter 24-1. Then, the decision end signal SX1 (or 22) is outputted from the OR gate 17-4 so that the subsequent generations of the clocks CK1 and CKR26 are interrupted, and the offset detection and adjustment of the output 8 of the non-inverted buffer amplifier 6 are ended.

The time period until the offset adjustment of all analog output signals described above can be set in advance. After the time period thus set, the end signal, i.e., a communication enabling signal READY, is fed from the aforementioned timer 20 to the semiconductor integrated circuit having the offset adjustor packaged therein, and another circuit packaged in the portable communication terminal unit, if necessary.

Figure 21:
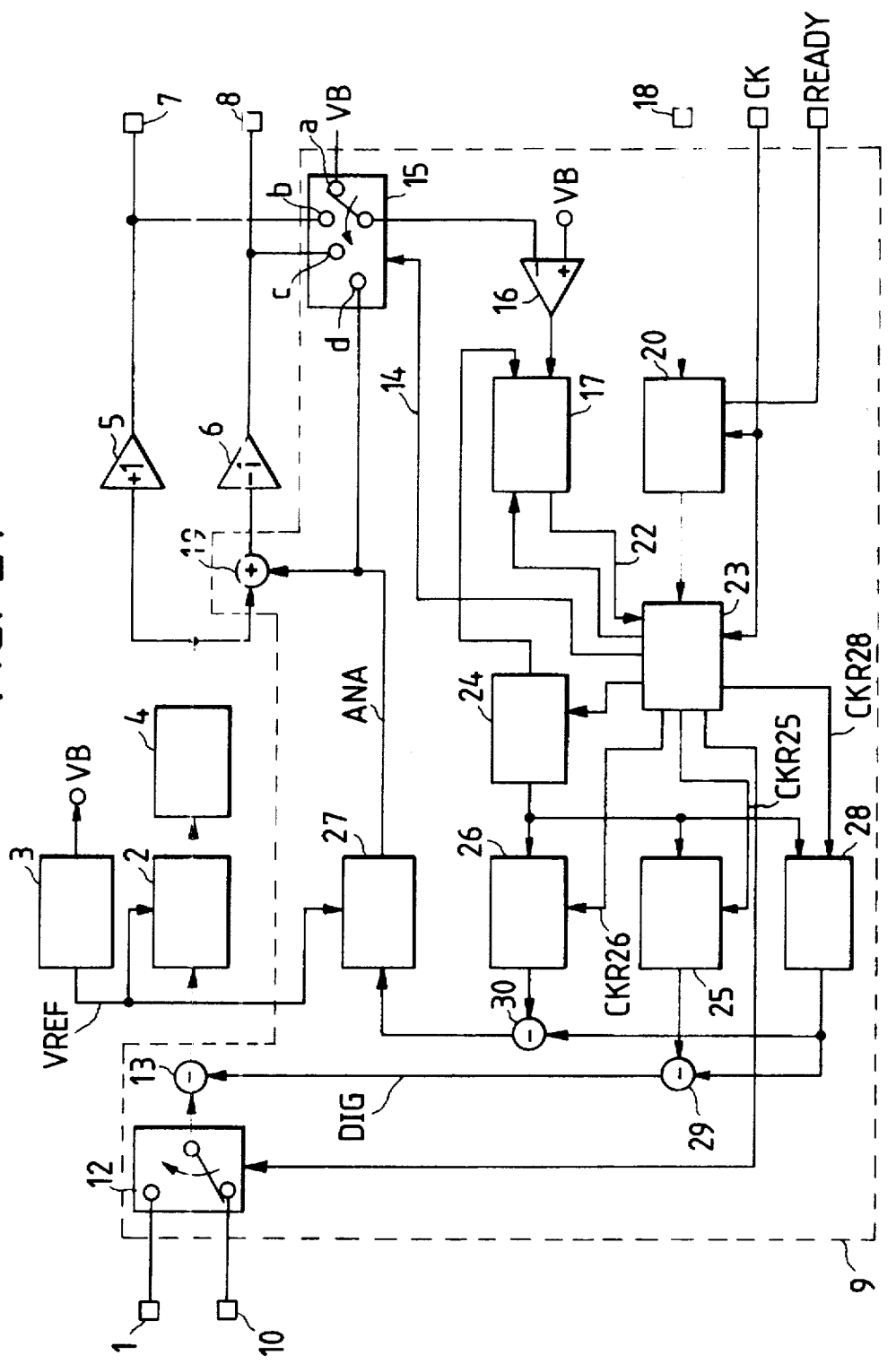
FIG. 21 is a block diagram showing a second embodiment of the offset adjustor according to the present invention.

FIG. 21 shows a second embodiment of the offset adjustor according to the present invention. The second embodiment of FIG. 21 is different from the first embodiment of the offset adjustor shown in FIG. 16 in that, after the offset of the voltage comparator 16 itself is detected and held in a third register 28 prior to the offset detection and adjustment of the non-inverted analog output 7 and the inverted output 8 on the basis of the output of the aforementioned main D/A converter 2, the offset adjusted negative feedback signal DIG for the non-inverted analog output 7 and the offset adjusted negative feedback signal ANA for the inverted output 8, are corrected using digital subtractors 29 and 30. The remaining constructions and operations are identical to those of the foregoing embodiment, and their detailed description will be omitted.

In the second embodiment of the offset adjustor shown in FIG. 21, the offset detection of the voltage comparator 16 itself is executed in the following manner. First of all, when the supply voltage and the signal 18 such as the reset signal PRST, are fed to the electronic circuit including the present offset adjustor 9 so that the information signal VRON (or 21) indicating that the output voltages VREF and VB of the reference voltage feed circuit 3 is outputted from the timer 20, as described above, there are sequentially issued from the pulse circuit 23 the single-shot pulse SXO, the control signal 11 for switching the switch 12 to feed the offset detecting reference digital signal 10 to the main D/A converter 2, and the control signal 14 for switching the switch 15 to switch the analog signal to be fed to the voltage comparator 16 from the reference voltage VB of the terminal a to the output (at the terminal d) of the auxiliary D/A converter 27.

In accordance with the polarity of the output of the voltage comparator 16, the counting operation of the bidirectional counter 24 is started. The outputs of the bidirectional counter 24 are sequentially latched by the aforementioned third register 28 in response to the clock CKR28 coming from the pulse circuit 23. The signal, which is converted from the output of the third register 28 into the analog voltage to be increased at a constant step interval by the auxiliary D/A converter 27, is negatively fed back to the voltage comparator 16 through the aforementioned switch 15. As a result, when the output of the voltage comparator 16 is inverted, the decision end signal SX1 (or 22) is outputted from the decider 17, and the offset detection of the voltage comparator 16 is ended so that the result is latched in the register 28.

The subsequent offset detection adjustment and the READY signal outputting operation at the end are identical to those of the first embodiment of the offset adjustor, as shown in FIG. 16. The value latched by the register 28 is reflected upon the negative feedback signals DIG and ANA when the values of the register 25 or 26 is to be determined.

Figure 22:
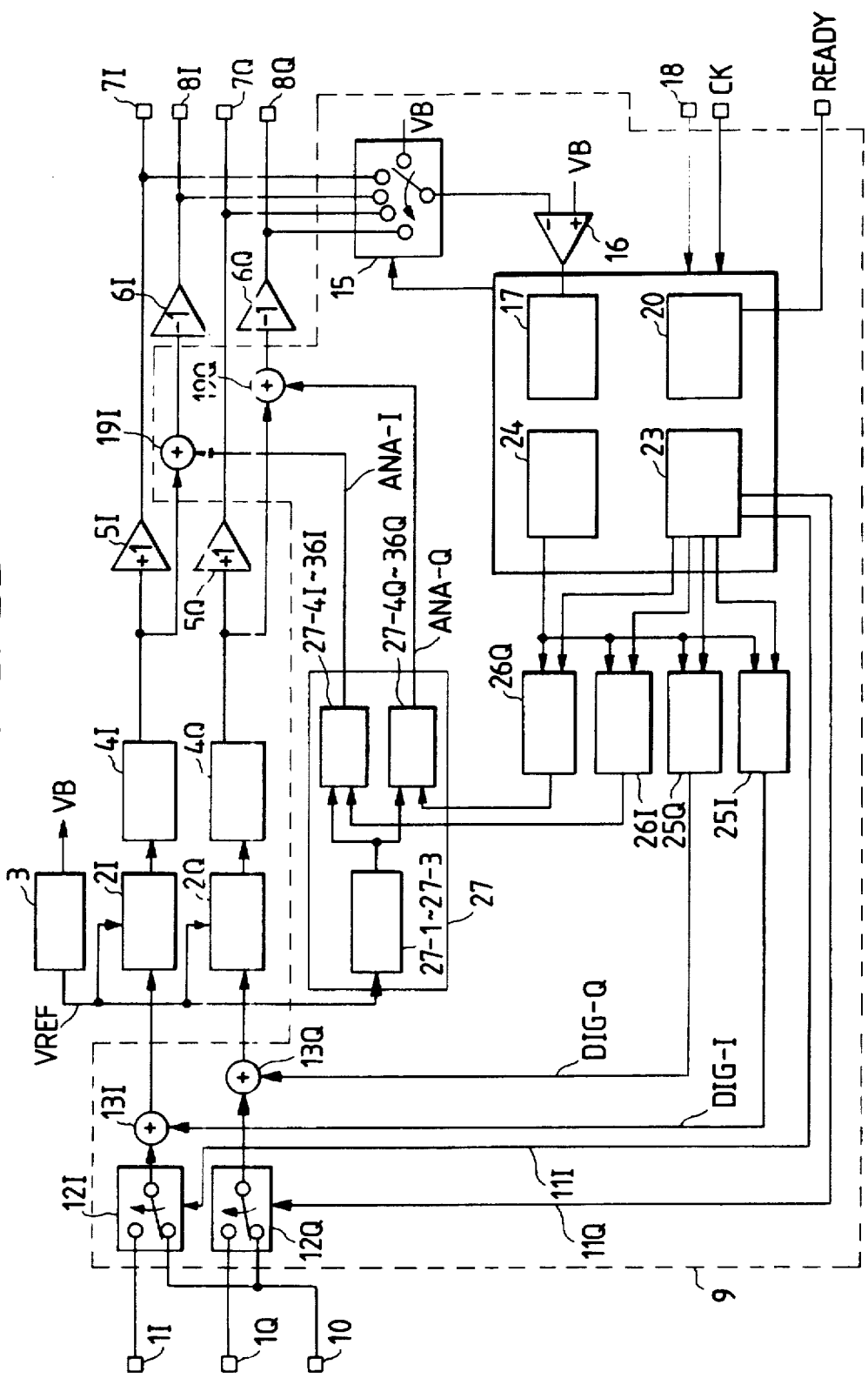
FIG. 22 is a block diagram showing a third embodiment of the offset adjustor according to the present invention.

FIG. 22 shows a third embodiment of the offset adjustor according to the present invention. This third embodiment is similar to the first embodiment of the offset adjustor shown in FIG. 16 but further includes: two sets of circuits (I and Q) each composed of the main D/A converter 2, the low pass filter 4, the non-inverted buffer 5 and the inverted buffer 6 which are provided to give an orthogonal phase difference of 90 degrees to the non-inverted outputs (7I and 7Q) and inverted outputs (8I and 8Q) of the analog signals which are outputted in a manner to correspond to the individual digital input signals; the circuits necessary for adjusting the offsets of the aforementioned fourth analog outputs 7I, 7Q, 8I and 8Q respectively equipped with switches 12I and 12Q for switching and inputting the main signals 1I and 1Q and the offset detecting reference signal 10 to the corresponding main D/A converters 2I and 2Q; four registers 25I, 25Q, 26I and 26Q for latching the output of the bidirectional counter 24; adders 13I and 13Q, two sets of analog switches and output buffers 27-4I to 36I and 27-4Q to 36Q of the auxiliary D/A converter 27 shown in FIG. 18; and adders 19I and 19Q.

The detector 17, the timer 20, the counter 24 and the pulse circuit 23 are commonly used for the two systems the I system and the Q system. The offset detecting and adjusting operations are omitted, as shown in FIG. 22, because they could be easily understood from the description of the foregoing embodiments. However, the order of the offset adjusting operations of the analog outputs 7I and 7Q, and 8I and 8Q, is not limited thereto.

In the description made above, the signal 18 has been handled as the reset signal for the power supply. Alternatively, the supply voltage is in the supply state, and the signal 18 may be either a control signal for switching the electronic circuit from the low current consumption state, i.e., the standby state, to the ordinary operation state, or a synthesized signal which is the OR signal of said control signal and the reset signal when the power is supplied.

Figure 23:
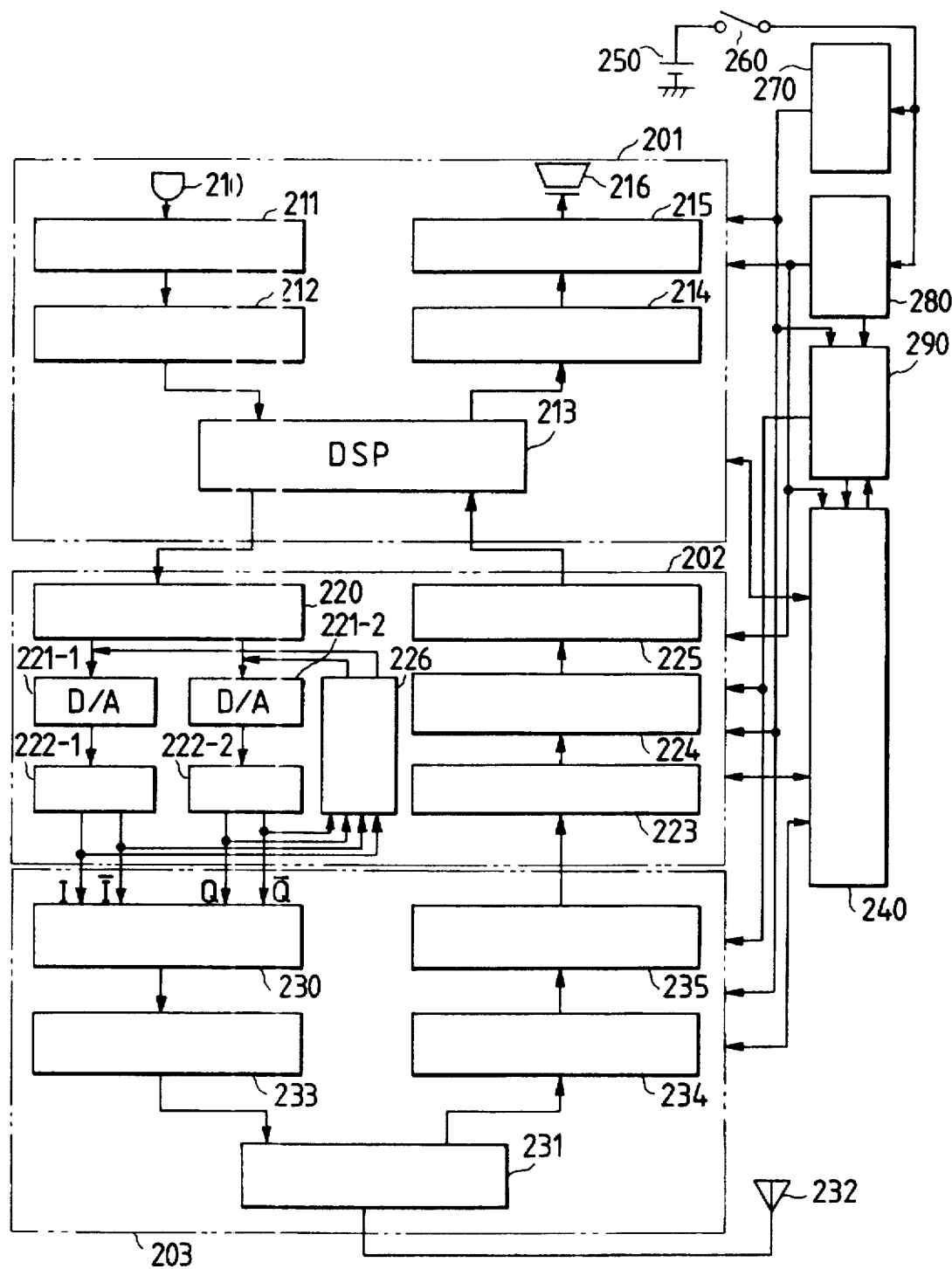
FIG. 23 is a block diagram showing one example of a phase modulator/demodulator and a portable communication terminal unit, in which is packaged the offset adjustor according to the present invention.

FIG. 23 shows one example of the portable communication terminal unit in which is packaged the offset adjustor according to the present invention. This portable communication terminal unit is constructed of a speech coding/decoding unit 201, a phase modulating/demodulating unit 202 and a high frequency unit 203. Moreover, these individual units 201 to 203 have their operation order and circuit activities/inactivities controlled by the signals or pulses coming from a microcomputer 240, a reset signal generator 280 and a clock generator 290.

The speech coding/decoding unit 201 is constructed to include: a pre-filter 211 for suppressing the high frequency noise component of the transmitted analog speech signals inputted from a microphone; an A/D converter 212 for converting the output of the pre-filter into digital signals; a digital signal processor (as will be abbreviated into "DSP") 213 for compressing the band of the output of the A/D converter 212 and for extending the band of the compressed received digital speech signals to restore the original band; a D/A converter 214 for converting the band-extended output of the DSP 213 into analog speech signals; a post-filter 215 for suppressing the high frequency component of the output of the D/A converter 214 and amplifying the output; and a speaker 216 to be driven by the output of that post filter 215.

The aforementioned phase modulating/demodulating unit 202 is constructed to include: a phase modulator 220 for subjecting the signals outputted from the aforementioned DSP 213 to a modulation suited for the radio transmission such as the /4 shift QPSK modulation; a D/A converter 221 for converting the output of the phase modulator 220 into analog signals; a post-filter 222 for suppressing the high frequency component contained in the output of the D/A converter 221; a phase/voltage converter 223 for suppressing the wide-band noise component contained in the received modulated signals and for converting the phase information into a voltage; an A/D converter 224 for converting the output of the phase/voltage converter 223 into digital signals; a phase demodulator 225 for demodulating the original fundamental signal component from the output of that A/D converter 224; and an offset adjustor 226 according to the present invention.

The aforementioned phase modulator 220 is often realized by a read only memory ROM. According to the construction of the system, there may be provided in parallel a plurality of sets of the phase modulator 220, the D/A converter 221 and the post-filter 222 so as to provide a phase difference of 90 degrees or an orthogonal signal output or to output signals in positive or opposite phases.

There are shown two systems of the D/A converter and the post-filter, as designated at 221-1 and 222-1, and the D/A converter and the post-filter, as designated at 221-2 and 222-2. The D/A converters and post-filters of the two systems and the offset adjustor 226, as shown in FIG. 23, may be given the circuit construction of FIG. 22, for example. Alternatively, there may be provided the two systems of the circuit of FIG. 16 or 21.

The aforementioned high frequency unit 203 is constructed to include: an orthogonal modulator 230 for modulating the signals outputted from the aforementioned post-filter 222 orthogonally and with a radio frequency carrier signal of about 800 MHz to 2 GHz; a high power amplifier 233 for amplifying the output of the modulator 230 to a predetermined transmission power and for exciting an antenna 232 through a transmission/reception switching switch 231; an amplifier 234 for amplifying the signals received through the antenna 232 and the switch 231; and a detector 235 for detecting a desired signal from the output of the amplifier 234.

The aforementioned orthogonal modulator 230 may be composed, according to the construction of the system, of a plurality of stages for effecting a modulation with a rather low frequency such as 455 KHz or 90 MHz and then a modulation with a radio frequency carrier signal having a predetermined frequency of 800 MHz to 2 GHz. Moreover, the detector 235 may also be composed of a plurality of stages in accordance with the construction of the system.

A power switch 260 is mounted on the casing of the portable communication terminal unit. The operating power is supplied either from a battery 250 mounted in the terminal unit or the power supply outside of the terminal unit to the individual portions of the terminal unit either through a voltage regulator 270 or partially directly. Here, the voltage regulator 270 operates to supply a substantially constant voltage to the individual portions in the terminal unit even if the voltage level is fluctuated by the discharge due to either the exhaust of the battery 250 or the charging operation.

The reset signal generator 280 generates a signal for resetting the data latched in the registers of the individual portions of the terminal unit, if necessary, when the power switch 260 is ON. The signal generated is the signal 18 shown in FIG. 16 and FIGS. 20 to 22. The clock generator 290 generates the stable clocks to be fed to the individual portions in the terminal unit. The clock generator 290 is usually constructed of a temperature-stabilized quartz oscillator and means for dividing or multiplying the frequency of the output of the quartz oscillator. In addition to the control microcomputer 240, the reset signal generator 280, the clock generator 290, the battery 250, the power switch 260 and the voltage regulator 270, as exemplified above, the portable communication terminal unit is further equipped with a key pad, a dial signal generator and a calling signal generator, although not shown.

The phase modulating/demodulating unit 202 having the offset adjustor 226 packaged therein, and the remaining electronic circuits 201 and 203, are individually constructed to reduce the operating voltage and the power consumption. In the speech coding/decoding unit 201, for example, the major circuit portions have their operations interrupted by detecting no-speech state. In the phase modulating/demodulating unit 202 and the high frequency unit 203, moreover, not only are the operations of the major circuit portions only interrupted for no speech but also intermittently effected to suppress the power consumption by making use of the specification of the system construction that the radio communications are time-shared and multiplexed. These controls are carried out by the microcomputer 240 detecting the states of the individual portions.

In addition, the offset adjustor 226 of this invention is operated by the control signal 18 only when the power is supplied or the standby is released, as described above. At the end of the offset detection, the operations of the registers 25, 26 and the auxiliary D/A converter 27 necessary for maintaining the feed of the offset adjusted negative feedback signals, are held only for the speaking period. Whereas the remaining circuit portions are inactivated to inoperative states. In the example of FIG. 21, the register 28 is also activated.

Thus, it is possible to realize the optimum phase modulating/demodulating unit 202 for the battery drive and the portable communication terminal unit having the unit 202 packaged therein. Specifically, when the power is supplied to the portable communication terminal unit to effect the power-on reset, and when the circuits contained in the phase modulating/demodulating unit 202 of the portable communication terminal unit are wholly or partially brought from the standby state to the speakable state, the microcomputer 240 activates the individual circuit portions composing the offset adjustor 226 and changes the signal 18, as shown in FIGS. 16, 21 and 22, to start the offset adjusting operations by the offset adjustor 226.

After the offset adjusting operations have been started, the microcomputer 240 monitors the interval of the signal SX1, as shown in FIG. 20, or the pulse change of the signal SX1 by using a timer (not shown) or the like contained therein. If said signal does not change for the time period which could be deemed as the end of the offset adjustment, the microcomputer 240 enables the aforementioned fixed offset adjusted negative feedback signals to be continuously fed back by maintaining only the registers 25 and 26 and the auxiliary D/A converter 27 of the individual circuits in their operable states.

As a result, the circuits to be used only for detecting and setting the amount of negative feedback, that is, the pulse circuit 23, the counter 24, the logic circuit 17, the timer 20 and the voltage comparator 16, as shown in FIG. 16, are inactivated to suppress the power consumption. When the phase modulating/demodulating unit 202 is shifted to the standby state, the negative feedback of the offset adjusted negative feedback signal is not substantially required any more so that the microcomputer 240 inactivates all the circuits composing the offset adjustor 226.

The following operational effects can be attained from the individual embodiments thus far described.

(1) Thanks to the construction of a plurality of unit D/A converters coupled in series or in parallel, for converting a digital signal of a predetermined bit divided from an input digital signals into an analog current and for returning the weighing of the current corresponding to the input digital signal through a corresponding current converter, it is possible to drastically reduce the number of current sources and switches required to each unit D/A converter, in accordance with the attenuation or amplification factor of the current converter.

(2) Thanks to the above effect (1), it is possible to reduce the layout area required by the D/A converter and to reduce the parasitic capacitance of the MOSFET switch to be coupled to the current output line and accordingly, the power consumption of the MOSFET switch.

(3) Thanks to the above effects (1) and (2), it is possible to promote the reductions of the size, power consumption and cost of the portable communication terminal unit including the D/A converter while enhancing the communication characteristics of the terminal unit.

(4) The current converter is constructed to include the operational amplifier, the first resistor connected between the inverted input and output of the amplifier, and the second resistor connected with the output of the operational amplifier. The current attenuation may be set by the resistance ratio of the first and second resistors. These first and second resistors are made of the same resistance material so that the influence of the process dispersion can be lightened.

(5) The current converter is exemplified by an inverted output type. The predetermined bit digital signal to be fed to each D/A converter is fed, after having been inverted to every other unit D/A converters, to correspond to the so-called "difference from the binary value 15" so that the current source connected between the supply voltage VCC current output line can always be used to current value of the current source constituting each unit D/A converter easily and precisely thereby to promote the higher precision of the D/A converter.

(6) Prior to the application of an actual input signal to the D/A converter, a fixed digital signal corresponding to a DC signal providing a reference in the signal to be offset-canceled is inputted. The individual offsets of a plurality of analog output signals obtained by branching the outputs of the D/A converter and having a phase difference of about 180 degrees in positive and opposite phases, are detected. After this, at least one of the offset adjusted negative feedback signals for setting the DC offset value of the individual analog outputs to a desired value, is exemplified by the digital signal to be fed back to the input portion of the D/A converter. At least another negative feedback signal is exemplified by the analog signal obtained by branching the output of the D/A converter which is fed back to the path portions. As a result, the offsets of the plurality of analog output signals having different phases, can be detected and adjusted independently and highly precisely by the reduced circuit construction.

(7) The offset adjustor is constructed to include: the switch means for selecting and outputting a plurality of analog signals for offset adjustment; the comparison means for comparing the output of the switch means and the reference potential for the offset detection; the detection means for detecting the inversion of the output polarity of the comparison means; the counting means for performing a series of counting operations until the inversion of the output polarity of the comparison means in the initial state of the counted value is detected by the detection means; the plurality of memory means made receptive to the output of the counting means and disposed individually for the offset adjusted negative feedback signals; the D/A conversion means for converting the output of the memory means corresponding to the offset adjusted negative feedback signal from a digital signal to an analog signal; and the timing generating means for utilizing the single comparison means in a time sharing manner by effecting the selection of the analog signal by the switch means and the selection of the memory means for latching the output of the counting means sequentially for every offset adjusted negative feedback signals. As a result, it is possible to minimize not only the dispersion of the amounts of the adjusted offsets between the plurality of analog signals to have their offsets cancelled, but also the circuit construction for canceling the offset of the comparison means itself, thereby to the circuit construction for the offset adjustment.

(8) The comparison means includes the differential amplifier stage for receiving the output of the switch means and the reference voltage for the offset detection, and the output stage for receiving the single end output from the differential amplification stage, so that the constant current transistors of the differential amplification stage and the constant current transistors of the output stage are fed with the bias voltages of the different bias voltage feed paths. As a result, the fluctuation in bias voltage due to the high fluctuation of the potential of the output stage exerts no influence upon the differential amplification stage so that the differential stage is always fed with a constant current.

(9) The portable communication terminal unit including the transmitting unit or the transmitting/receiving unit, and the offset adjustor for adjusting the offsets of the circuits contained in the transmitting unit or the transmitting/receiving unit further includes the control means for: activating all the circuits composing the offset adjustor for a predetermined time period after the power is supplied to the portable communication terminal unit and before the generation of the offset adjusted negative feedback signal by the offset adjustor is fixed, and for a predetermined time period after the transmitting unit or the transmitting/receiving unit or a portion of the circuits contained therein, are brought from the standby state to the communication state and before the generation of the offset adjusted negative feedback signal by the offset adjustor is fixed; for activating only the plurality of memory means and the D/A converter of the aforementioned circuit to maintain the generation of the fixed offset adjusted negative feedback signal; and for inactivating all the circuits composing the offset adjustor when in the standby state. As a result, the phase modulating/demodulating unit and the portable communication terminal unit having the former packaged therein, can be changed to a lower power consumption unit optimized for battery drive.

Although our invention has been specifically described in connection with its embodiments, it can naturally be modified in various manners without departing from the gist thereof. In the embodiments of FIGS. 1 to 12, for example, the bit number of the digital signals to be fed to the unit D/A converters at the individual stages can be arbitrarily set. For an input digital signal of 8 bits, for example, the least significant 5 bits may be assigned to the less significant bit unit D/A converters, and the more significant three bits may be assigned to the more significant bit unit D/A converters. The current sources and switches composing each unit D/A converter can hake the so-called "stack construction", as shown in FIG. 15.

All the plurality of unit D/A converters composing the D/A converter may be constructed on the basis of thermometer coders or current sources for feeding currents corresponding to the weights of digital signals. Each current converter can also be constructed by arranging one pair of MOSFETs of different sizes in the current mirror shape. Moreover, the D/A converter can be constructed from other fundamental elements such as bipolar transistors. A variety of modes of embodiment can be taken for the specific construction of the individual unit D/A converters and current converters, the polarity and absolute value of the supply voltage, and the conduction type of MOSFETs.

In FIG. 14, the portable communication terminal unit can be equipped with a key-pad, a dial signal generator, a calling signal generator, a controlling microcomputer, a clock signal generator, and a power circuit powered by a battery, for example. Moreover, the modulation by the modulator MOD2 of the high frequency unit HF may adopt the method in which the modulation is performed first with a relatively low frequency of about 455 KHz or 90 MHz and then with a radio frequency carrier signal of about 800 MHz to 2 GHz. The base band unit BB, the intermediate frequency unit IF and the high frequency unit HF composing the portable communication terminal unit may be formed on different semiconductor substrates. A variety of modes of embodiments can be used for the block structures of the individual units and a specific frequency of the carrier signal.

Although the foregoing embodiments have been described in connection with the D/A converter and the offset adjustor for the plurality of analog outputs of the former, the present invention should not be limited thereto. The present invention can be applied to produce offset compensation for a parallel type A/D converter by adjusting the two higher and lower reference voltages necessary for generating a resistance dividing reference voltage composing the parallel type A/D converter.

Although our invention has been mainly described as applied to the current drive type D/A converter to be packaged in the portable communication terminal unit, it should not be limited thereto but can also be applied to either the D/A converter itself or the feedback comparison signal generating local D/A converter contained in the sequential comparison type or oversampling type A/D converter. Thus, the present invention can be widely applied not only to the current drive type D/A converter but also to the device or system including such D/A converter.

As to the offset adjustor, on the other hand, our invention has been described mainly as applied to the portable communication terminal unit for wireless telephones. The present invention should not be limited thereto but can be widely applied to communication LSI or the LSI required to detect and adjust the DC voltages having its signal components superimposed.

The effects to be obtained by the invention disclosed herein will be briefly described in the following. Specifically, the current drive type D/A converter to be packaged in the portable communication terminal unit is basically constructed of the plurality of unit D/A converters coupled in series or in parallel through the corresponding current attenuators or current amplifiers for individually converting digital signals of a predetermined bit into analog currents. The current sources to be disposed in those unit D/A converters are constructed of identical unit current sources so that the number of current sources and switches required of each unit D/A converter can be drastically reduced. Thus, it is possible to reduce the necessary layout area of the D/A converter and to reduce the parasitic capacitance of the switch MOSFETs coupled to the current output lines thereby to reduce the power consumption. As a result, it is possible to promote the reductions of the size, power consumption and cost of the portable communication terminal unit including the D/A.

The current converter is constructed to include the operational amplifier, the first resistor connected between the inverted input and output of the amplifier, and the second resistor connected with the output of the operational amplifier for signal conversion. The current attenuation may be set by the resistance ratio of the first and second resistors. These first and second resistors are made of the same resistance material so that the influence of the process dispersion can be lightened.

The current converter is exemplified by an inverted output type. The predetermined bit digital signal to be fed to each D/A converter is fed, after having been inverted to every other unit D/A converters, to correspond to the so-called "difference from the binary value 15" so that the current source connected between the supply voltage VCC and each current output line can always be used to set the current value of the current source constituting each unit D/A converter easily and precisely thereby to promote higher precision.

The offset adjusted negative feedback signal is composed of: the digital signal to be negatively fed back to the path to the input of the D/A converter; and the analog signal to be negatively fed back to the system which is branched midway from the system having its offset adjusted by the offset adjusted negative feedback signal acting as the aforementioned digital signal. As a result, the offsets of the plurality of analog output signals obtained by branching the output of the D/A converter and having different phases can be detected and adjusted independently and highly precisely by the reduced circuit construction.

By utilizing the single comparison means in a time sharing manner, it is possible to minimize not only the dispersion of the adjusted offsets between the plurality of analog signals to have their offsets cancelled, but also the circuit construction for cancelling the offset of the comparison means itself, thus contributing to the simplification of the circuit construction. Moreover, the output offsets of the electronic circuits having the plurality of analog signal outputs, can be adjusted highly precisely and stably.

By adopting the voltage comparing means for separating the bias voltages of the constant current transistors contained in the differential stage and the bias voltages of the constant current transistors contained in the output stage, the bias voltage fluctuation due to the high fluctuations of the potential of the output stage is enabled to prevent influence upon the differential stage and to feed a constant current to the differential stage at all times so that a precise decision can be realized.

All the circuits composing the offset adjustor are operated when the power is supplied and when the standby is released. Only the memory means for feeding the offset adjusted negative feedback signals and the auxiliary D/A converter are held operative during the communication after the offset detection has been ended, leaving the other circuit portions inactive. As a result, the phase modulating/demodulating unit and the portable communication terminal unit having the former packaged therein have their power consumption reduced and optimized for the battery drive.

What is claimed is:

1. A semiconductor integrated circuit device including a first circuit for outputting a digital signal and a second circuit for subjecting first and second analog signals having different phases to a predetermined processing, comprising:

a converter for converting a digital signal into an analog signal;

a branching circuit coupled to the output of said converter for producing said first analog signal and said second analog signal from said analog signal;

a first offset adjustor coupled between said first circuit and said converter for arranging a digital signal to be fed to said converter, in accordance with an adjusting digital signal for adjusting the offset of said first analog signal from said digital signal; and a second offset adjustor coupled between said branching circuit and said second circuit for arranging said second analog signal to be fed to said second circuit, in accordance with an adjusting analog signal for adjusting the offset of said second analog signal from said digital signal.

2. A semiconductor integrated circuit device including a D/A converter, comprising:

an offset adjustor for adjusting the offsets of a plurality of analog signals obtained by branching the output of said D/A converter and having different phases, wherein said offset adjustor generates a plurality of offset adjusting negative feedback signals, of which at least one is a digital signal to be negatively fed back to a path at the input side of said D/A converter whereas the others are analog signals to be negatively fed back to systems branched midway from the system which has its offset adjusted by the offset adjusting negative feedback signal or said digital signal.

3. A semiconductor integrated circuit device according to claim 2, wherein said plurality of analog signals having different phases are a plurality of analog signals having different phases of about 180 degrees in positive and opposite relations, whereby the offsets of the positive phase analog signals are adjusted by negatively feeding back said digital signal to the input portion of said D/A converter whereas the offsets of the remaining analog signals in the opposite or positive phases are adjusted by negatively feeding back said analog signals to the signal path portions of said branched systems.

4. A semiconductor integrated circuit device according to claim 3, wherein said digital signal is negatively fed back to the input portion of said D/A converter whereas said analog signals are negatively fed back to the output path of said-D/A converter.

5. A semiconductor integrated circuit device according to claim 2, wherein said offset adjustor includes:

switch means for selecting and outputting the plurality of analog signals to have their offsets adjusted;

comparison means for comparing the output of said switch means and the reference potential for detecting the offsets;

detection means for detecting the inversion of the output polarity of said comparison means;

counting means for performing a series of counting operations till the inversion of the output polarity of said comparison means in the initial state of a counted value is detected by said detection means;

a plurality of memory means made receptive of the output of said counting means and individually provided for said offset adjusting negative feedback signals;

D/A conversion means for converting the output of the memory means corresponding to the offset adjusting negative feedback signal or the analog signal from a digital signal to an analog signal; and timing generating means for performing the section of the analog signal by said switch means and the selection of said memory means for latching the output of said counting means, sequentially for the individual offset adjusting negative feedback signals so that said single comparison means may be used in a timing sharing manner.

6. A semiconductor integrated circuit device according to claim 5, wherein said comparison means includes a differential amplification step for receiving the output of said switch means and the reference voltage for detecting the offsets, and an output step for receiving a single end output from said differential amplification step, and wherein said differential amplification step and said output step have their constant current transistors fed with bias voltages from different bias voltage feed paths.

7. A semiconductor integrated circuit device according to claim 6, wherein said differential amplification step includes: a pair of differential amplification MOS transistors of a first conduction type; a first constant current MOS transistor of the first conduction type connected with the common source of said pair of differential amplification MOS transistors; a MOS transistor of a second conduction type having its gate and drain coupled to the drain of one of said differential MOS transistors; and a MOS transistor of the second conduction type having its gate coupled to the drain said one differential MOS transistor and its drain coupled to the drain of the other of said differential MOS transistors, and wherein said output step includes: an output MOS transistor of the second conduction type having its gate connected with the drain of said other differential MOS transistor; and a second constant current MOS transistor having its drain connected with the drain of said output MOS transistor and fed with a bias voltage through a path different from said first constant current MOS transistor.

8. A semiconductor integrated circuit device according to claim 2, wherein said D/A converter includes: a plurality of unit D/A converters made individually receptive of a plurality of digital signals of a predetermined bit divided from an input digital signal and using reference currents having equal values; and means for converting analog currents outputted from said unit D/A converters into currents corresponding to the weights of corresponding input digital signals, to synthesize the converted currents.

9. A portable communication terminal unit including a transmitting unit or a transmitting/receiving unit having a D/A converter, comprising:

an offset adjustor for adjusting the offsets of a plurality of analog signals of different phases produced by branching the output of said D/A converter, wherein said offset adjustor includes: a generator for generating a signal for adjusting the offsets; first memory means for storing that offset adjusting digital signal of said offset adjusting signals generated, which is to be negatively fed back to the input side of said D/A converter; second memory means for storing that digital signal of said offset adjusting signals generated, which corresponds to an offset adjusting analog signal to be negatively fed back to said branched signal path; and a D/A converter made receptive of the digital signal stored in said second memory means, for generating said offset adjusting analog signal; and control means: for activating all the circuits composing said offset adjustor for a predetermined time period after the power is supplied to said portable communication terminal unit and before the generation of the offset adjusting negative feedback signal by said offset adjustor is fixed, and for a predetermined time period after the transmitting unit or the transmitting/receiving unit of said portable communication terminal unit or the circuits contained therein are brought after the power supply from the standby state to the communication prepared state and before the generation of the offset adjusting negative feedback signal by said offset adjustor is fixed; thereafter for activating only said first memory means and said second memory means of said offset adjustor and said D/A converter; and for inactivating all the circuits composing said offset adjustor when in said standby state.

* * * * *